(12) United States Patent
Asano et al.

(10) Patent No.: US 7,732,868 B2
(45) Date of Patent: Jun. 8, 2010

(54) SEMICONDUCTOR DEVICE

(75) Inventors: Tetsuro Asano, Ora-gun (JP); Mikito Sakakibara, Kumagaya (JP); Toshikazu Hirai, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 626 days.

(21) Appl. No.: 10/521,941

(22) PCT Filed: Nov. 28, 2002

(86) PCT No.: PCT/JP02/12424

§ 371 (c)(1), (2), (4) Date: Feb. 6, 2006

(87) PCT Pub. No.: WO2004/027869

PCT Pub. Date: Apr. 1, 2004

(65) Prior Publication Data

US 2006/0151816 A1    Jul. 13, 2006

(30) Foreign Application Priority Data

Sep. 9, 2002   (JP)  ............... 2002-262845

(51) Int. Cl.
   *H01L 29/812* (2006.01)
(52) U.S. Cl. ............... 257/355; 257/280; 257/E29.242
(58) Field of Classification Search .......... 257/355
   See application file for complete search history.

(56) References Cited

U.S. PATENT DOCUMENTS

| 4,261,004 | A |   | 4/1981  | Masuhara et al. |
|-----------|---|---|---------|-----------------|
| 4,339,285 | A |   | 7/1982  | Pankove         |
| 4,387,386 | A |   | 6/1983  | Garver          |
| 4,626,802 | A |   | 12/1986 | Gailus          |
| 4,745,445 | A |   | 5/1988  | Mun et al.      |
| 4,803,527 | A | * | 2/1989  | Hatta et al. ................. 257/280 |
| 4,843,440 | A |   | 6/1989  | Huang           |
| 4,965,863 | A |   | 10/1990 | Cray            |
| 5,047,355 | A |   | 9/1991  | Huber et al.    |
| 5,157,573 | A | * | 10/1992 | Lee et al. ...................... 361/56 |
| 5,371,405 | A |   | 12/1994 | Kagawa          |
| 5,374,899 | A |   | 12/1994 | Griffiths et al. |
| 5,559,363 | A |   | 9/1996  | Immorlica, Jr.  |
| 5,654,860 | A |   | 8/1997  | Casper et al.   |

(Continued)

FOREIGN PATENT DOCUMENTS

CN    1492585    4/2004

(Continued)

OTHER PUBLICATIONS

Miyawaki, Yasuo et al. (1986) "Ion-Implanted Low Noise Dual-Gate GaAs MESFET," Sanyo Technical Review 18(2), pp. 76-84.

(Continued)

*Primary Examiner*—Jerome Jackson, Jr.
(74) *Attorney, Agent, or Firm*—Morrison & Foerster LLP

(57) ABSTRACT

A protecting element, comprising a first n+-type region, an insulating region, and a second n+-type region, is connected in parallel between two terminals of an FET. Since discharge across the first and second n+ regions is enabled, electrostatic energy that reaches the operating region of the FET can be attenuated without increasing the parasitic capacitance.

16 Claims, 12 Drawing Sheets

U.S. PATENT DOCUMENTS

| | | | |
|---|---|---|---|
| 5,684,323 | A | 11/1997 | Tohyama |
| 5,821,827 | A | 10/1998 | Mohwinkel et al. |
| 5,841,184 | A | 11/1998 | Li |
| 5,932,917 | A | 8/1999 | Miura et al. |
| 5,986,863 | A | 11/1999 | Oh |
| 6,002,860 | A | 12/1999 | Voinigescu et al. |
| 6,265,756 | B1 | 7/2001 | Brockett et al. |
| 6,580,107 | B2 | 6/2003 | Higashino et al. |
| 6,914,280 | B2 | 7/2005 | Asano et al. |
| 6,946,891 | B2 | 9/2005 | Asano et al. |
| 7,193,255 | B2 | 3/2007 | Asano |
| 2002/0024375 | A1 | 2/2002 | Asano et al. |
| 2002/0047177 | A1 | 4/2002 | Asano et al. |
| 2004/0077150 | A1 | 4/2004 | Tosaka |
| 2004/0130380 | A1 | 7/2004 | Asano et al. |
| 2004/0222469 | A1 | 11/2004 | Asano et al. |
| 2004/0223274 | A1 | 11/2004 | Asano et al. |
| 2005/0121730 | A1 | 6/2005 | Asano et al. |
| 2005/0263796 | A1 | 12/2005 | Asano |
| 2005/0274979 | A1 | 12/2005 | Asano |
| 2005/0277255 | A1 | 12/2005 | Asano |
| 2005/0285143 | A1 | 12/2005 | Asano |
| 2006/0163609 | A1 | 7/2006 | Asano et al. |
| 2006/0163659 | A1 | 7/2006 | Asano et al. |
| 2006/0164150 | A1 | 7/2006 | Asano |
| 2006/0252651 | A1 | 11/2006 | Asano et al. |
| 2006/0255403 | A1 | 11/2006 | Asano et al. |
| 2006/0289963 | A1 | 12/2006 | Asano et al. |

FOREIGN PATENT DOCUMENTS

| | | |
|---|---|---|
| DE | 3334167 A1 | 4/1985 |
| EP | 0140095 A1 | 5/1985 |
| EP | 0 700 161 | 3/1996 |
| JP | 57-128983 | 8/1982 |
| JP | 60-86874 | 5/1985 |
| JP | 62-174975 | 7/1987 |
| JP | 2-162744 | 6/1990 |
| JP | 8-236549 | 9/1996 |
| JP | 2723936 | 11/1997 |
| JP | 11-220093 | 8/1999 |
| JP | 2002-368194 | 12/2002 |
| JP | 2004-103786 | 4/2004 |
| KR | 1998-043416 | 9/1998 |
| KR | 1998-065222 | 10/1998 |
| KR | 2002-93613 | 12/2002 |
| WO | WO-96/22613 | 7/1996 |
| WO | WO-97/45877 | 4/1997 |
| WO | WO-97/45877 A1 | 12/1997 |

OTHER PUBLICATIONS

Physics of Semiconductor Devices, pp. 116-123.

Anderson, W.R. et al. "ESD Protection under Wire Bonding Pads," EOS/ESD Symposium, Jan. 1, 1999, pp. 88-94.

European Search Report dated Dec. 3, 2008 directed towards foreign application No. 02788677.9; 4 pages.

European Office Action directed towards a counterpart EP application No. 02788677.9 mailed Mar. 5, 2009; (5 pages).

European Search Report dated Jul. 6, 2009 directed towards related foreign application EP03794280.2; (3 pages).

European Search Report mailed Sep. 21, 2009, directed to EP Patent Application No. 03 794 280.2; 6 pages.

Asano, T., U.S. Office Action mailed on Feb. 5, 2009, directed to a related U.S. Appl. No. 11/314,101; 7 pages.

Asano, T., U.S. Office Action mailed on Jun. 11, 2008, directed to a related U.S. Appl. No. 11/314,101; 9 pages.

Asano, T., U.S. Office Action mailed on Jan. 25, 2006, directed to a related U.S. Appl. No. 10/772,585; 7 pages.

Asano, T., U.S. Office Action mailed on Sep. 6, 2006, directed to a related U.S. Appl. No. 10/772,585; 7 pages.

Asano, T., U.S. Office Action mailed on Sep. 18, 2006 directed to a related U.S. Appl. No. 10/505,438; 15 pages.

Asano, T., U.S. Office Action mailed on Mar. 2, 2006, directed to a related U.S. Appl. No. 10/505,438; 13 pages.

Asano, T., U.S. Office Action mailed on Jan. 6, 2009, directed to a related U.S. Appl. No. 11/314,178; 11 pages.

Asano, T., U.S. Office Action mailed on Jul. 17, 2008, directed to a related U.S. Appl. No. 11/314,178; 13 pages.

* cited by examiner

Electrostatic breakdown voltage
across respective terminals (unit: V)

| IN − Ctl−1 | 700 |
|---|---|
| IN − Ctl−2 | 700 |
| OUT1 − Ctl−1 | 700 |
| OUT2 − Ctl−2 | 700 |

Electrostatic breakdown voltage across respective terminals (unit: V)

| IN—Ctl-1 | 140 |
|---|---|
| IN—Ctl-2 | 140 |
| OUT1—Ctl-1 | 500 |
| OUT2—Ctl-2 | 450 |

US 7,732,868 B2

SEMICONDUCTOR DEVICE

BACKGROUND OF THE INVENTION

1. Field of the Invention

This invention concerns a semiconductor device, in particular, a semiconductor device that is greatly improved in terms of the electrostatic breakdown voltage.

2. Description of the Related Art

The general consumer-use microwave device market, which began with the appearance of satellite broadcast receivers, has enlarged rapidly in scale with the worldwide spread of cellular phones and presently, the market for wireless broadband applications is about to emerge substantially. In these markets gallium arsenide (GaAs) devices, which are suited for microwave applications, and Si microwave devices, resulting from the making of conventional Si devices finer and arranging three-dimensional structures to achieve lower parasitic capacitance and lower parasitic resistance, are mainly used.

FIG. 13 is a circuit diagram of a compound semiconductor switching circuit device. The source electrodes (or drain electrodes) of first and second FET's, FET1 and FET2, are connected to a common input terminal IN, the gate electrodes of FET1 and FET2 are respectively connected to first and second control terminals Ctl-1 and Ctl-2 via resistors R1 and R2, and the drain electrodes (or source electrodes) of FET1 and FET2 are connected respectively to first and second output terminals OUT1 and OUT2. The control signals applied to the first and second control terminals Ctl-1 and Ctl-2 are complementary signals and the FET to which the H level signal is applied is made to turn ON and transmit the input signal applied to common input terminal IN to one of the output terminals. The resistors R1 and R2 are disposed for the purpose of preventing high-frequency signals from leaking via the gate electrodes to the DC potential of the control terminals Ctl-1 and Ctl-2 which are AC grounded.

FIG. 14 shows an example of a compound semiconductor chip designed by integrating this compound semiconductor switching circuit.

FET1 and FET2, which perform switching, are disposed at central parts of a GaAs substrate, and the resistors R1 and R2 are connected to the respective gate electrodes of the FET's. Also, pads, respectively corresponding to the common input terminal IN, the output terminals OUT1 and OUT2, and the control terminals Ctl-1 and Ctl-2, are disposed at peripheral parts of the substrate. A gate metal layer (Ti/Pt/Au) 20, which is formed at the same time as the forming of the gate electrodes of the respective FET's, is a second-layer wiring and indicated by dotted lines, and a pad metal layer (Ti/Pt/Au) 30, which connects the respective elements and form the pads, is a third-layer wiring, indicated by solid lines. An ohmic metal layer (AuGe/Ni/Au) of a first layer wiring, which is in ohmic contact with substrate, forms the source electrodes and drain electrodes of the respective FET's and take-out electrodes at the ends of the respective resistors, and this layer is not illustrated in FIG. 14 as it overlaps with the pad metal layer.

FET1, shown in FIG. 14, is formed in a rectangular operating region 12 that is surrounded by alternate long and short dash lines. The three third-layer pad metal layer 30 parts, which take on the form of comb teeth that extend from the lower side, are a source electrode 13 (or drain electrode) connected to output terminal OUT1, and below this is disposed a source electrode 14 (or drain electrode), formed by a first-layer ohmic metal layer 10. Also, the three third-layer pad metal layer 30 parts, which take on the form of comb teeth that extend from the upper side, are a drain electrode 15 (or source electrode), connected to common input terminal IN, and below this is disposed a drain electrode 14 (or source electrode), formed by the first-layer ohmic metal layer 10. These electrodes are disposed in the form of engaged comb teeth and a gate electrode 17, formed on an operating region 12 from the second-layer gate metal layer 20, is disposed in between in the form of five comb teeth. A central drain electrode 15 (or source electrode) that extends from the upper side is used in common by FET1 and FET2 to further contribute to size reduction. Here, that the gate width is 600 μm means that the total gate width of the comb-teeth-like gate electrode 17 of each FET is 600 μm.

As described above, with a conventional switching circuit device, no measures are taken in particular for protection against electrostatic breakdown.

FIG. 15 shows the results of measuring the electrostatic breakdown voltage of the switching circuit device shown in FIG. 14. Here, the electrostatic breakdown voltage is measured under the following conditions. That is, after applying a test voltage to the terminals of a test capacitor of 220 pF and thereby charging electricity in the test capacitor, the wiring for voltage application is cut off. Thereafter, the charged electricity in the test capacitor is discharged between the terminals of a tested element (FET) without resistance factor nor inductance factor inserted and whether or not the FET breaks down is measured. If the FET does not break down, the test is repeatedly carried out with the first application voltage being increased by 10V at a time, and the application voltage at which the FET breaks down is measured as the electrostatic breakdown voltage.

As is clear from this figure, since measures for improving the electrostatic breakdown voltage are not taken in the conventional art, the electrostatic breakdown voltage is the lowest and only 140 V between common input terminal IN and control terminal Ctl-1 and between common input terminal IN and control terminal Ctl-2.

Also, there is variation of the electrostatic breakdown voltage depending between which terminals the electrostatic breakdown voltage is measured. Though the specific mechanism that determines this electrostatic breakdown voltage is unclear, with a switching circuit device, the value of the minimum electrostatic breakdown voltage between two terminals is generally of the level of 100 V or less as mentioned above, and the finest care was required for handling. That is, the electrostatic breakdown voltage value for the terminals between which the electrostatic breakdown voltage is the minimum governs the electrostatic breakdown voltage of the element as a whole, and thus improvement of the electrostatic breakdown voltage between these terminals is the subject.

Besides, unlike other devices for audio, video and power supply applications, microwave communication devices are low in the internal Schottky junction or PN junction capacitance and these junctions are weak against static electricity.

Generally in order to protect a device against static electricity, a method, in which an electrostatic breakdown protecting diode is connected in parallel between the terminals of a PN junction or Schottky junction that is damaged readily by electrostatic discharge, in a device, may be considered. However, this method could not be applied to a microwave device since increased parasitic capacitance due to connection of a protecting diode causes degradation of the high-frequency characteristics.

SUMMARY OF THE INVENTION

This invention has been made in view of the various circumstances mentioned above and provides a solution firstly by an arrangement having an FET, to be a protected element and comprising in turn a gate electrode, a source electrode, and a drain electrode, connected to operating region surfaces provided on a substrate, and a gate terminal, a source terminal and a drain terminal respectively connected to the electrodes, and a protecting element, connected in parallel to any two of the terminals of the protected element and having an insulated region disposed between the two terminals of a first high concentration impurity region and a second high concentration impurity region. Electrostatic energy applied between the two terminals of the protected element is discharged between the first and second high concentration impurity regions, thereby attenuating the electrostatic energy that reaches the two electrodes corresponding to the two terminals of the protected element to a level that does not exceed the electrostatic breakdown voltage between the two electrodes.

This invention provides a solution secondly by an arrangement having as a protected element, a switching circuit, where first and second FET's, each provided with a source electrode, a gate electrode, and a drain electrode connected to operating region surfaces on a substrate, are formed, a terminal connected to a source electrode or a drain electrode common for both FET's is used as a common input terminal, terminals connected to the drain electrodes or the source electrodes of the respective FET's are respectively used as first and second output terminals, terminals connected to the gate electrodes of the respective FET's are respectively used as first and second control terminals, and control signals are applied to both of the control terminals, via resistors, which are connection means that connects both of the control terminals with the gate electrodes, to make one of the FET's turn on to form a signal path with the common input terminal and one of either the first or second output terminal. The arrangement also has a protecting element, connected in parallel between at least one of the control terminals and the input terminal of the protected element and having an insulated region disposed between a first high concentration impurity region and a second high concentration impurity region. Electrostatic energy applied from the exterior across the abovementioned at least one control terminal and the common input terminal is discharged between the first and second high concentration impurity regions to attenuate the electrostatic energy that reaches between electrodes respectively corresponding to the at least one control terminal and common input terminal to a level that does not exceed the electrostatic breakdown voltage between the electrodes.

DETAILED DESCRIPTION OF THE INVENTION

Embodiments of this invention shall now be described in detail.

First using FIGS. 1 to 8, a GaAs MESFET shall be described as a first embodiment of this invention.

Figure 1A:
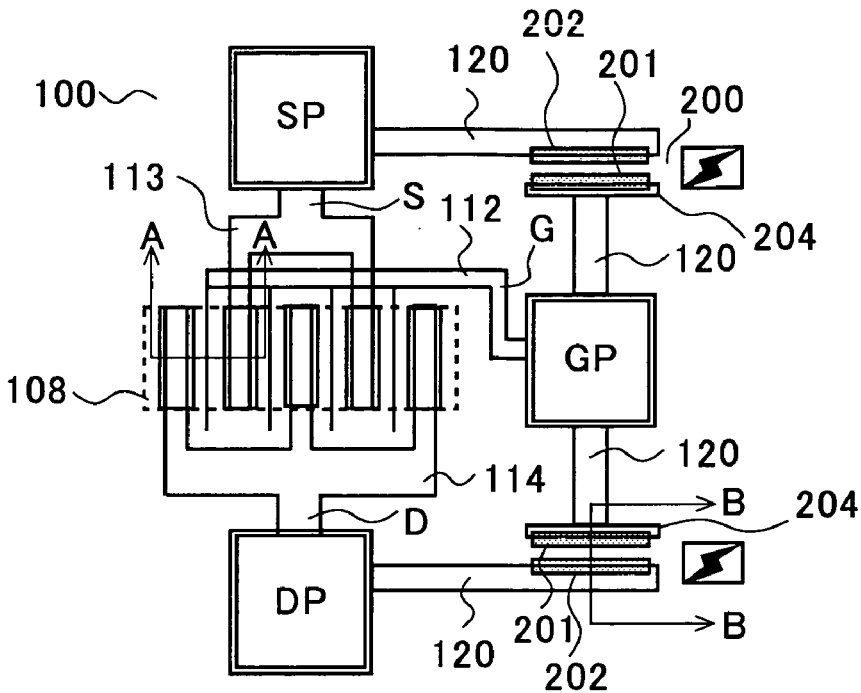
FIG. 1(A) is a plan view for describing this invention.
Figure 1B:
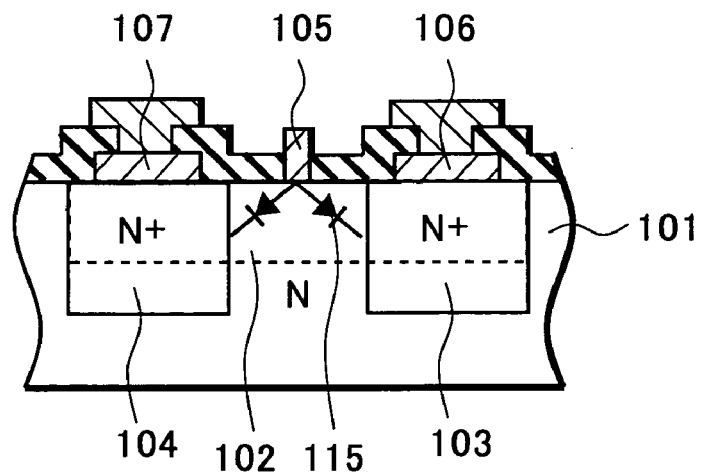
FIG. 1(B) is a sectional view for describing this invention.
Figure 1C:
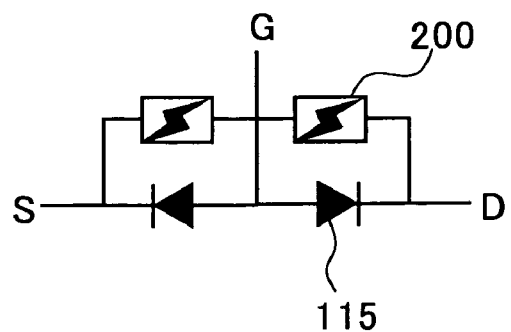
FIG. 1(C) is an equivalent circuit diagram for describing this invention.

FIG. 1 shows schematic diagrams of the first embodiment, with FIG. 1(A) being a plan view, FIG. 1(B) being a sectional view along line A-A of FIG. 1(A), and FIG. 1(C) being an equivalent circuit diagram of FIG. 1(A). This invention's semiconductor device is thus arranged from a protected element 100 and a protecting element 200.

As shown in FIGS. 1(A) and 1(B), protected element 100 is a MESFET comprising a gate electrode 105, which forms a Schottky junction with an operating layer 102 disposed on a GaAs surface that is a semi-insulating substrate 101, a source region 103 and a drain region 104, which are formed of high-concentration impurity regions disposed at the respective ends of the operating layer 102, and a source electrode 106 and a drain electrode 107, which form ohmic junctions with the surfaces of the abovementioned regions. Here, the operating layer 102 and the source and drain regions 103 and 104, to which the respective electrodes are connected, shall be referred to as an "operating region 108" of the FET, which is indicated by broken lines in FIG. 1(A).

In this specification, the gate electrode 105, the source electrode 106, and the drain electrode 107 within the FET operating region 108 are connected via a gate wiring 112, a source wiring 113, and a drain wiring 114 to a gate pad GP, a source pad SP, and a drain pad DP, respectively. Also the respective parts at which the gate wiring 112, the source wiring 113, and the drain wiring 114 are converged and lead to the corresponding pads shall be referred to as a gate terminal G, a source terminal S, and a drain terminal D.

With regard to the terminals, although illustration shall be omitted here, a protected element 100 does not have to have all of the gate pad GP, the source pad SP, and the drain pad DP and there may be cases where terminals exist even though pads are not disposed. For example, with a two-stage amp MMIC, in which two FETs are integrated, pads do not exist but terminals exist for the drain of the first stage FET and the gate of the subsequent stage FET.

The respective wiring 112, 113, and 114 are not restricted to metal wiring and may be resistors formed by an $n^+$ layer, etc. Also, the respective bonding pads SP, DP, and GP corresponding to the respective electrodes inside the operating region 108 are not restricted to being connected by uniform wiring but resistors, capacitors, inductors, etc., may be inserted in the middle of the wiring. That is, all cases, where some form of electrical signal, be it DC, AC, or high frequency, is transmitted between the respective electrodes within the operating region 108 and the corresponding bonding pads, are included.

Here as an example, the gate electrode 105, the source electrode 106, and the drain electrode 107 are respectively extended by the metal wiring 112, 113, and 114 and connected to the gate pad GP, the source pad SP, and the drain pad DP.

With a MESFET, the case that is weakest against electrostatic breakdown is the case where a surge voltage is applied between the gate terminal G and the source terminal S or between the gate terminal G and the drain terminal D, both of which are small in gate Schottky junction capacitance, with the gate terminal G side being made negative. In this case, static electricity is applied in reverse bias to a Schottky barrier diodes 115 formed at the interface between the operating region 108 and the gate electrode 105, which is disposed on the surface of the operating region 108.

As shown in FIGS. 1(B) and 1(C), when considering the electrostatic breakdown voltage in the GaAs MESFET 100, the gate Schottky junction is in a reverse bias state. That is, the equivalent circuit in this case is a circuit in which the Schottky barrier diodes 115 are connected between the gate terminal G and the source terminal S and between the gate terminal G and the drain terminal D.

For protection against electrostatic breakdown, electrostatic energy applied to the weak Schottky junctions of the gate electrode 105 should be reduced. Thus in this embodiment, the protecting element 200 is connected in parallel between two terminals of the MESFET 100 to form a path, which serves as a bypass that discharges a part of the electrostatic energy that is applied between the corresponding two terminals, to thereby protect the weak junction against electrostatic breakdown.

As shown in FIGS. 1(A) and 1(C), in this embodiment, a protecting elements 200 are respectively connected in parallel between the source pad SP and the gate pad GP, that is, between the two terminals of the source terminal S and the gate terminal G, and between the drain pad DP and the gate pad GP, that is, between the two terminals of the drain terminal D and the gate terminal G. Electrostatic energy that is applied from the bonding pads connected to two terminals can be discharged partially inside the protecting elements 200 by using respective wiring 120. That is, the electrostatic energy that reaches a gate Schottky junction in the FET operating region 108, which is weakest in electrostatic breakdown strength, is reduced to protect the FET 100 from electrostatic breakdown. Although the protecting elements 200 are connected to carry out discharge both between the gate terminal G and the drain terminal D and between the gate terminal G and the source terminal S, only one of protecting elements 200 may be connected.

Here, the protecting element 200 will be described using FIG. 2.

Figure 2:
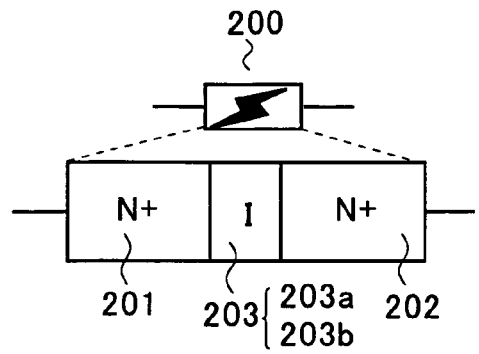
FIG. 2 is a schematic diagram for describing this invention.

FIG. 2 is a schematic diagram indicating protecting element.

As illustrated, the protecting element 200 of this specification is an element in which an insulating region 203 is disposed between the two terminals of a first high concentration impurity region 201 and a second high concentration impurity region 202 that are disposed close to each other. The first and second high concentration impurity regions 201 and 202 are formed by ion implantation and diffusion in a substrate 201. In this specification, although these high concentration impurity regions shall be described hereinafter as first $n^+$-type region 201 and second $n^+$-type region 202, the impurities does not have to be of the same type and may be of different types.

The first and second $n^+$-type regions 201 and 202 are separated by a distance that enables passage of electrostatic energy, for example, a distance of approximately 4 μm, and for both, the impurity concentration is $1 \times 10^{17}$ cm$^{-3}$ or more. The insulating region 203 is disposed in contact with and between the first and second $n^+$-type regions 201 and 202. Here, the insulating region 203 is not completely insulating in electrical terms but is a part 203a of a semi-insulating substrate or an insulated region 203b that has been made insulating by ion implantation of an impurity into the substrate 201. The insulating region 203 preferably has an impurity concentration of $1 \times 10^{14}$ cm$^{-3}$ or less and a resistivity of $1 \times 10^3$ Ωcm or more.

By disposing the high concentration impurity regions 201 and 202 in contact with the respective ends of the insulating region 203 and making the distance between the two high concentration impurity regions 201 and 202 approximately 4 μm, electrostatic energy, which is applied from the outside across two terminals of a protected element to which the two high concentration impurity regions 201 and 202 are respectively connected, can be discharged via the insulating region 203.

The distance of 4 μm between these two $n^+$-type regions is a suitable distance for passage of electrostatic energy, and with an separation of 10 μm or more, discharge will not occur reliably across the protecting element. The same applies to the impurity concentration of the $n^+$-type regions and the resistance value of the insulating region.

Under normal FET operation, since a voltage as high as that of static electricity will not be applied, a signal will not pass through the insulating region of 4 μm. Likewise, a signal will not pass through the insulating region of 4 μm even with a high-frequency wave, such as a microwave. Thus under normal operation, the protecting element is equivalent to being non-existent since it does not influence the characteristics in any way. However, static electricity is a phenomenon in which a high voltage is applied instantaneously, and in this case, electrostatic energy passes through the insulating region of 4 μm and is discharged between the high concentration impurity regions. Also, when the thickness of the insulating region becomes 10 μm or more, the resistance becomes large even for static electricity and discharge becomes less likely to occur.

These first $n^+$-type region 201 and second $n^+$-type region 202 are connected in parallel between two terminals of a protected element 100. The first and second $n^+$-type regions 201 and 202 may be used as they are as the terminals of the protecting element 200 or metal electrodes 204 may be provided additionally.

Figure 3A:
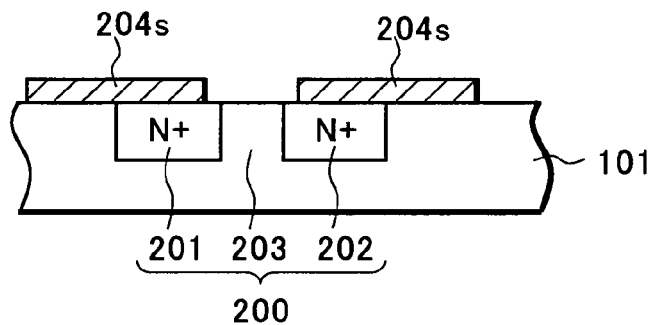
FIG. 3(A) is a sectional view for describing this invention.
Figure 3B:
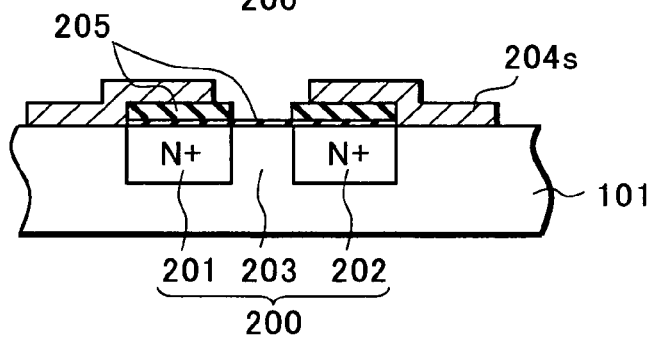
FIG. 3(B) is a sectional view for describing this invention.
Figure 3C:
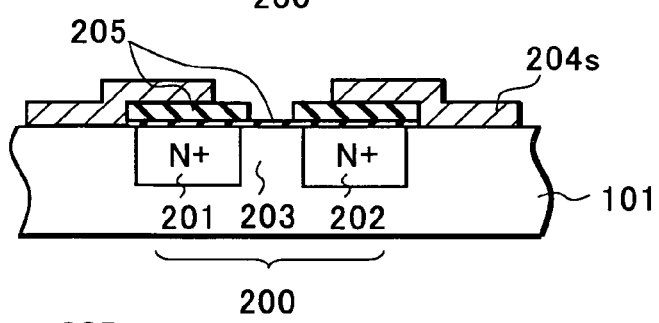
FIG. 3(C) is a sectional view for describing this invention.
Figure 3D:
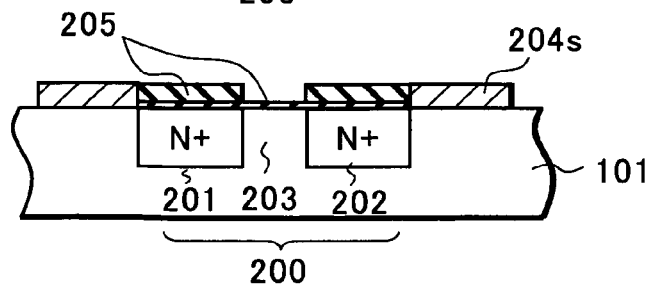
FIG. 3(D) is a sectional view for describing this invention.
Figure 4A:
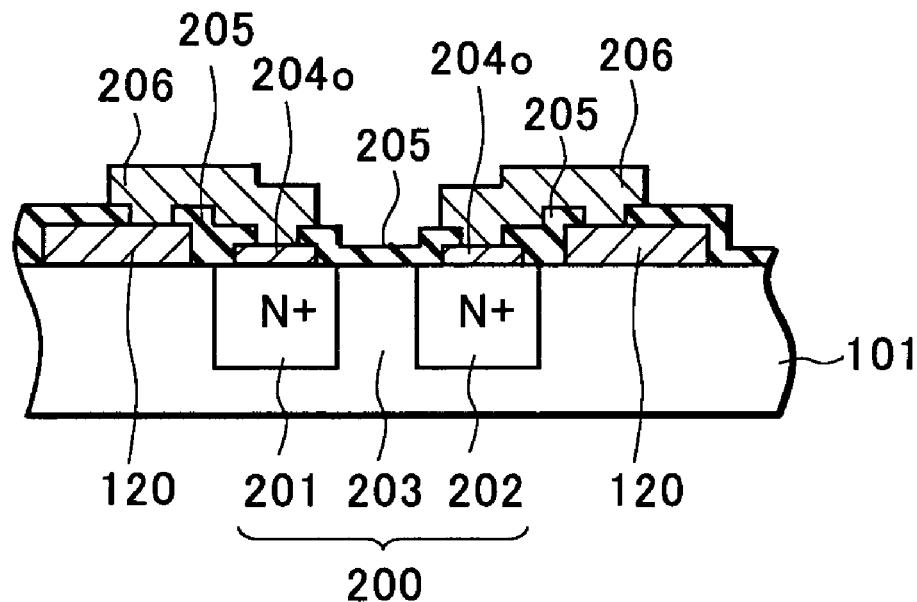
FIG. 4(A) is a sectional view for describing this invention.

Cases where the metal electrodes 204 are provided are illustrated in FIGS. 3 and 4. Such a metal electrode 204 is connected to a bonding pad or a wiring connected to a bonding pad that is connected to a terminal of the MESFET 100, which is the protected element. FIG. 3 shows the metal electrodes 204 that form Schottky junctions with the first and the second $n^+$-type regions 201 and 202, and FIG. 4 shows the metal electrodes 204 that form ohmic junctions. Here for the sake of convenience, these metal electrodes shall be described as Schottky junction metal electrodes 204s and ohmic junction metal electrodes 204o.

In FIG. 3(A), metal electrodes 204s form Schottky junctions with the surfaces of the first $n^+$-type region 201 and/or the second $n^+$-type region 202. The electrodes are formed on the surfaces of the first and the second $n^+$-type regions 201 and 202 are separated by 0.1 μm to 5 μm from the ends of the insulating region 203 in consideration of the mask aligning accuracy and the resistances of both the $n^+$ regions 201 and 202. An separation of 5 μm or more will make the resistance large and will not readily allow the passage of static electricity. The metal electrodes 204s may be formed on just the first and the second n⁺-type regions 201 and 202 or a part thereof may extend to the semi-insulating substrate 101 and form a Schottky junction with the substrate surface.

Or as shown in FIGS. 3(B) and 3(C), the metal electrodes 204s may be disposed on passivation nitride films or other insulating films 205 on the first and the second n⁺-type regions 201 and 202. In this case, the metal electrodes 204s are extended onto the semi-insulating substrate 101 and are connected via the substrate 101 to the first and the second n⁺-type regions 201 and 202. Furthermore, as shown in FIG. 3(D), a structure, wherein a metal layer is not formed on either of the n⁺-type regions 201 and 202 but the metal electrodes 204s form Schottky junctions with the semi-insulating substrate 101 at the outer sides of these regions, is also possible.

In all of the cases illustrated in FIGS. 3(B), 3(C), and 3D, the metal electrodes 204s are not connected directly with the first and/or the second n⁺-type regions 201 and 202. The metal electrodes 204s may thus have structures that form Schottky junctions with the substrate approximately 0 μm to 5 μm to the outer side from the ends of the first and/or the second n⁺-type regions 201 and 202. That is, as shown in FIGS. 3(B), 3(C), and 3(D), the first and the second n⁺-type regions 201 and 202 do not have to be in contact with the metal electrodes 204s, and within a distance of 5 μm, an adequate connection between the n⁺-type regions and the metal electrodes 204s can be secured via the semi-insulating substrate.

Meanwhile, FIG. 4 shows the metal electrodes 204o that form ohmic junctions with the first and/or the second N⁺-type regions.

The metal electrodes 204o may form ohmic junctions with the first and/or the second n⁺-type regions 201 and 202. Since the metal electrodes 204o cannot form ohmic junctions with the semi-insulating substrate 101, the metal electrodes 204o are not extended onto neighboring parts of the substrate 101 in this case. The metal electrode 204o is connected to the bonding pad (or a wiring connected to the bonding pad) 120 of the protected element, and in the case of an ohmic junction, the metal electrode 204o is connected to the pad (or a wiring) 120 via another metal layer 206.

An ohmic junction is lower in resistance than a Schottky junction and passes static electricity more readily. In this regard, an ohmic junction provides a larger protection effect against electrostatic breakdown than a Schottky junction.

However, with an ohmic junction, an ohmic electrode metal 204o is diffused deeply into the substrate and when the ohmic electrode metal 204o reaches the depth of the high concentration layer or more, the ohmic electrode metal 204o contacts the semi-insulating region of the substrate and in this case, the protecting element 200 itself readily undergoes electrostatic breakdown.

For example, if a metal is provided to form ohmic junctions with both the first n⁺ region 201 and the second n⁺ region 202, the distance between ohmic junctions is 10 μm, and the ohmic electrode metal 204o is diffused to the semi-insulating region of the substrate at the depth of the n⁺ regions 201 and 202 or more, an ohmic junction—insulating region—ohmic junction structure is formed at region deeper than the depth of the n⁺ regions, and since it is known that this structure is weak against electrostatic energy, the possibility that the protecting element itself will undergo electrostatic breakdown arises in this case.

Thus in a case where the ohmic electrode metal 204o is diffused to the semi-insulating region of the substrate at the depth of the two n⁺ regions or more, Schottky junctions must be formed instead, and in a case where the ohmic electrode metal 204o does not reach the depth of the n⁺ regions, ohmic junctions provide a greater protection effect.

Figure 4B:
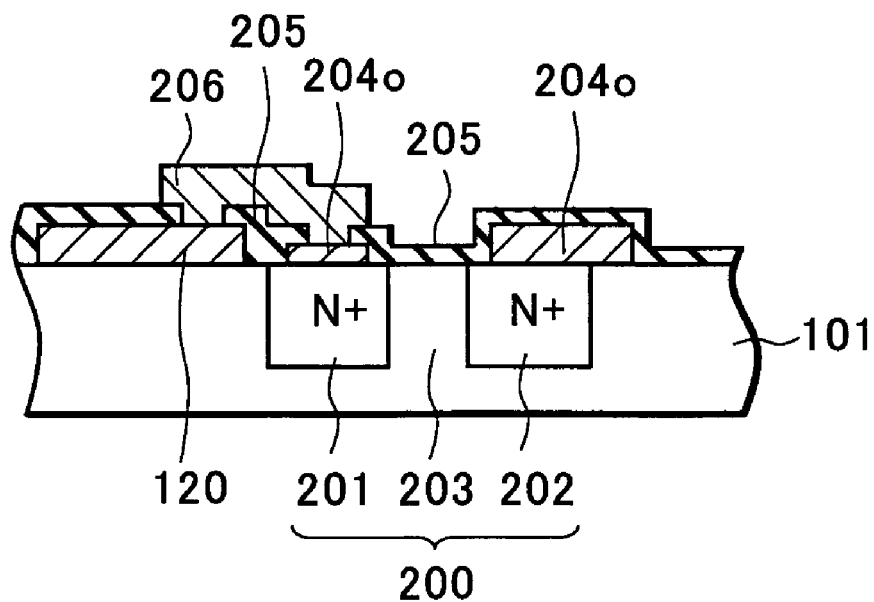
FIG. 4(B) is a sectional view for describing this invention.

Also, as shown in FIG. 4(B), it is not necessary for both of the two terminals of the protecting element 200 to have the same metal electrode structure and each of the first and the second n⁺-type regions may have any of the structures shown in FIGS. 3 and 4 individually. Furthermore, although an arrangement is possible in which one of the terminals has a metal electrode 204 and the other terminal does not have the metal electrode 204, the provision of metal electrodes is preferable in that the resistance is decreased and the protection effect is increased correspondingly.

Such a metal electrode 204 may be a part of a bonding pad or a part of a wiring connected to a bonding pad, and as shall be described in detail later, by using such bonding pads and wiring, the chip area can be prevented from increasing due to the connection of the protecting element 200.

Referring again to FIG. 1, an example, wherein the protecting element 200 is connected in parallel between a weak junction of the MESFET 100, shall be described.

The sectional view along line B-B of the protecting element of FIG. 3(A) is the same as that of FIG. 1(A). That is, in this specification, the connection of the protecting element 200 means forming the first n⁺-type region 201 and the second n⁺-type region 202 at a distance of 4 μm by implantation/diffusion on the surface of the semi-insulating substrate 101, on which the protected element 100 is formed, connecting the first n⁺-type region 201 to one of the terminals of the FET and connecting the second n⁺-type region 202 to another terminal of the FET, and the protecting elements 200 and MESFET 100, which is the protected element, are integrated in the same chip. In the case where the substrate surface is not semi-insulating, the insulated region 203 is formed by ion implantation of impurity between the two n⁺-type regions 201 and 202.

Also, for the sake of description, the first n⁺-type region 201 shall be the terminal of the protecting element 200 that is connected to the gate terminal G, which is one of the terminals of FET, and the second n⁺-type region 202 shall be the terminal of the protecting element 200 that is connected to the source terminal S or the drain terminal D, which is the other terminal, in this specification. That is, in FIG. 1, two protecting elements 200 are connected to the FET 100 and the first n⁺-type region 201 of each is connected via the metal electrode 204 to the gate pad GP and the second n⁺-type region 202 is connected via the metal electrode 204 to the drain pad DP or the source pad SP. The metal electrodes 204 form Schottky junctions with the first and the second n⁺-type regions 201 and 202 ad parts of the metal electrodes 204 are extended to the semi-insulating substrate 101 to form Schottky junctions with the substrate surface. The structure of the metal electrode 204 is only an example and may be that of either FIGS. 3 and 4.

That is, each of these protecting elements 200 has its first n⁺-type region 201, which is to be one terminal, connected to the gate pad GP and its second n⁺-type region 202, which is to be the other terminal, connected to the source pad SP or the drain pad DP via the wiring 120 that are connected to the respective pads and thus connected in parallel between the gate terminal G and source terminal S or between the gate terminal G and drain terminal D, each corresponding to a connection of the FET.

Electrostatic energy that is applied between the gate terminal G and the source terminal S or between the gate terminal G and the drain terminal D can thus be discharged partially in the protecting element 200. The electrostatic energy reaching gate Schottky junctions in the FET operating region that are weakest in electrostatic breakdown strength can thus be attenuated greatly and the FET can be protected from electrostatic breakdown. Discharge is performed between the gate terminal G and the source terminal S and between terminal G and drain terminal D or between one the pair of terminals. That is, by this structure, the electrostatic breakdown voltage of the FET can be improved significantly in comparison to the conventional structure that does not use a protecting element.

Whereas with the conventional art, 100% of the electrostatic energy applied between the gate terminal G and the source terminal S or between the gate terminal G and the drain terminal D is transmitted to the operating region 108, in this invention, a part of the electrostatic energy is bypassed to the protecting element 200 by use of the respective wiring and bonding pads and discharged inside the protecting element 200. The electrostatic energy that is transmitted to the operating region 108 can thereby be attenuated to a level that does not exceed the electrostatic breakdown voltage between the gate electrode and source electrode or between the gate electrode and drain electrode of the operating region 108.

Figure 5A:
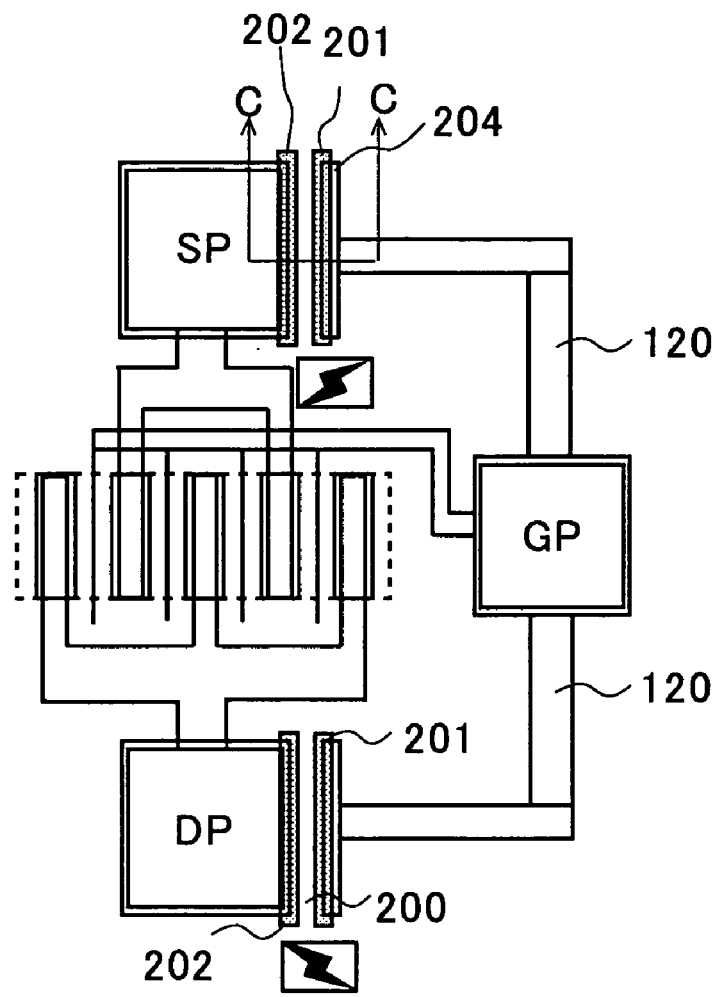
FIG. 5(A) is a plan view for describing this invention.
Figure 5B:
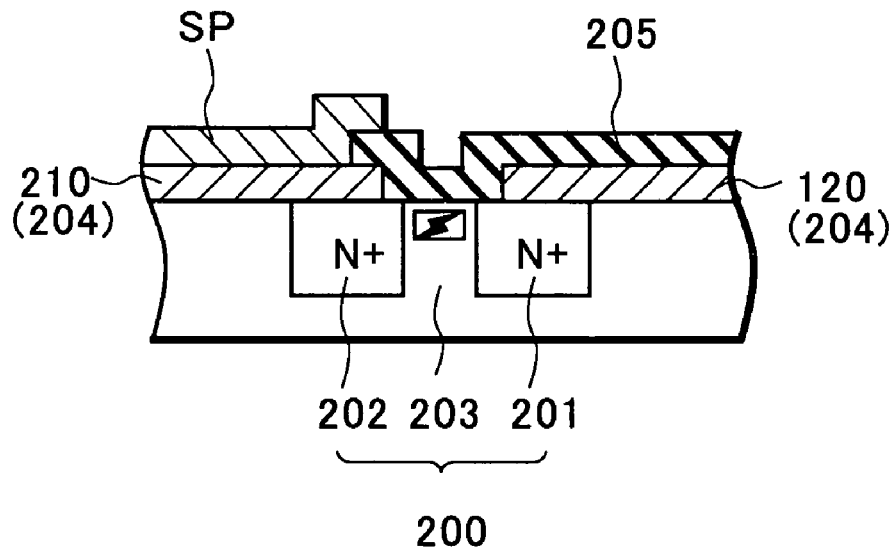
FIG. 5(B) is a sectional view for describing this invention.

FIG. 5 shows an example of using a bonding pad as the metal electrode of one of the terminals of a protecting element. FIG. 5(A) is a plan view, and FIG. 5(B) is a sectional view along line C-C.

In FIG. 1, an example, in which the wiring 120 are lead out from the source pad SP and the drain pad DP and the protecting elements 200 are connected to these wiring 120, was illustrated. FIG. 5 shows a structure in which the second $n^+$-type regions 202, each forming a Schottky junction with a Schottky metal layer 210 of the lowermost layer of each bonding pad, are provided and a part of each of the source pad SP and the drain pad DP is used as a metal electrode 204 connected to the second $n^+$-type region 202.

Each of the first $n^+$-type regions 201 is disposed so as to be adjacent the second $n^+$-type region 202 and is connected to the wiring 120 that is connected to the gate pad GP. By thus connecting the second $n^+$-type regions 202 directly to the source pad SP and the drain pad DP, which are connected to other terminals of the FET, and placing protecting elements 200 adjacent the respective pads, the electrostatic energy can be discharged directly into the protecting elements 200 from the source and the drain pads SP and DP, thereby providing a large improvement effect in terms of the electrostatic breakdown voltage, and furthermore since the space in the surroundings of the pads can be used effectively, increase in the chip area due to the addition of the protecting elements 200 can be prevented.

Also, although not illustrated, by connecting the first $n^+$-type regions 201 directly to the gate pad GP and furthermore placing the second $n^+$-type regions 202 adjacent the first $n^+$-type regions 201 and connecting them to the wiring 120 connected to the source pad SP and the drain pad DP, the electrostatic energy can be discharged directly from the gate pad GP into the protecting element 200, thus likewise providing a large improvement effect in terms of the electrostatic breakdown voltage and yet preventing increase in the chip area due to the addition of the protecting elements 200.

Figure 6:
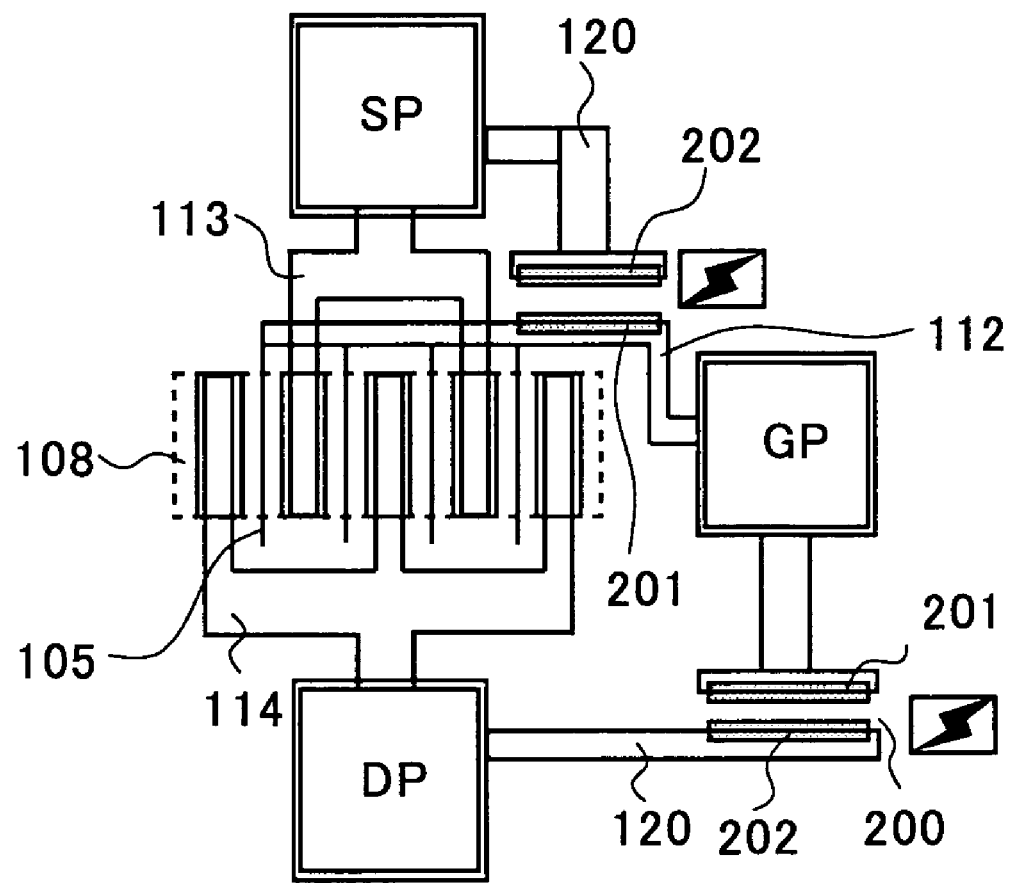
FIG. 6 is a plan view for describing this invention.

FIG. 6 shows an example of connecting the protecting element 200 in the middle of a signal path. As mentioned above, the Schottky junctions of the gate electrode 105 are weakest against electrostatic breakdown and the part that undergoes electrostatic breakdown most substantively is the gate electrode 105 part on the operating region 108. Thus by connecting the protecting element 200 in the middle of a signal path from the gate pad GP to the gate electrode 105 on the operating region 108 as shown in FIG. 6, the most effective protection against electrostatic breakdown can be provided.

In this case, the first $n^+$-type region 201 is connected to a part of the gate wiring 112 leading from the gate pad GP to the operating region 108. The second $n^+$-type region 202 is connected to the source pad SP, the drain pad DP or a the wiring 120 that is connected to either pad. For example, between the gate and the source in FIG. 6, in order to position the second $n^+$-type region 202 adjacent the first $n^+$-type region 201, the wiring 120 from the source pad SP is extended to the part of the second $n^+$-type region 202.

For example, by connecting the gate wiring 112 to the operating region 108 upon making it run adjacent the source pad SP or the drain pad DP, the protecting element 200 can be connected in the middle of a signal path and yet adjacent a pad of the FET to provide a more effective protection against electrostatic energy.

The type of the protecting element 200, which is integrated on the same substrate as the FET 100, shall now be described using FIG. 7. The operating region 108 of the FET 100 may be of any of the structures described below. In each of FIGS. 7(A) to 7(D), the left diagram shows the FET's operating region 108 and the right diagram shows the protecting element 200, which is integrated on the same substrate.

Figure 7A:
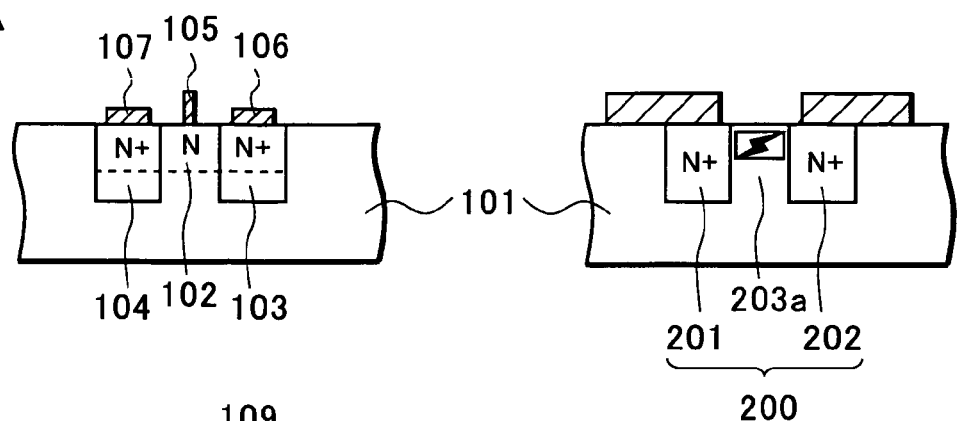
FIG. 7(A) is a sectional view for describing this invention.

First, with the arrangement shown in FIG. 7(A), for example, an n-type operating layer 102 is formed by ion implantation on the semi-insulating substrate 101, and at the respective ends of this layer, an n+ type source region 103 and drain region 104 are formed to thereby form the operating region 108. This is a MESFET in which the source electrode 106 and the drain electrode 107 are disposed as ohmic electrodes on the source region 103 and the drain region 104 and the gate electrode 105, which forms Schottky junction with the n-type operating layer 102, is provided. In this case, the two terminals 201 and 202 of the protecting element 200 are preferably formed at the same time as the source region 103 and the drain region 104 of the operating region 108 for the simplification of processes and are separated by 4 μm from each other on semi-insulating substrate 101. The protecting element has a first n+-type region 201—semi-insulating region 203a—second n+-type region 202 structure. In this case, the protecting element 200 protects the gate Schottky junction from electrostatic breakdown.

Figure 7B:
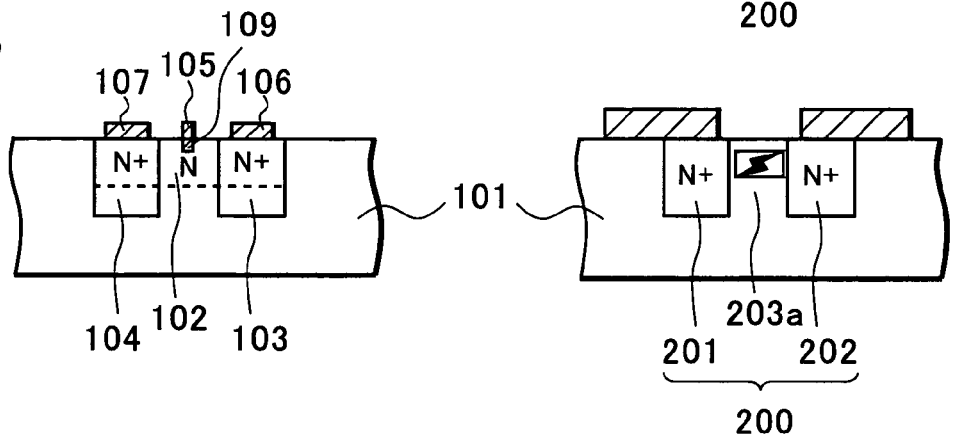
FIG. 7(B) is an sectional view for describing this invention.

With the FET of FIG. 7(B), for example, the n-type operating layer 102 is formed by ion implantation on the semi-insulating substrate 101, and at the respective ends of this layer, the n+ type source region 103 and the drain region 104 are formed to thereby form the operating region 108. This is a junction type FET wherein the source electrode 106 and the drain electrode 107 are disposed as ohmic electrodes on the source region 103 and the drain region 104 and the gate electrode 105, which is in ohmic junction with a p+-type gate region 109 formed inside the n-type operating layer 102, is provided. In this case, the two terminals 201 and 202 of the protecting element 200 are preferably formed at the same time as the source region 103 and the drain region 104 of the operating region 108 for the simplification of processes and are separated by 4 μm from each other on the semi-insulating substrate 101. The protecting element 200 has a first n+-type region 201—semi-insulating region 203a—second n+-type region 202 structure. In this case, the protecting element protects the gate PN junction from electrostatic breakdown.

Figure 7C:
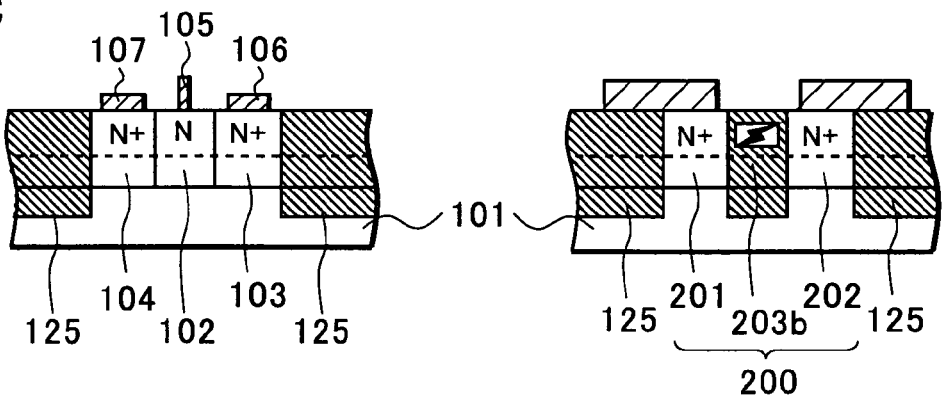
FIG. 7(C) is a sectional view for describing this invention.

The operating layer 102 of the FET of FIG. 7(C) is, for example, fabricated with an n type epitaxial layer onto the semi-insulating substrate 101, and at the respective sides of this layer, an n+-type impurity is implanted to form the source region 103 and the drain region 104. This is a MESFET in which the source electrode 106 and the drain electrode 107 are disposed as ohmic electrodes above the source region 103 and the drain region 104 and the gate electrode 105, which forms Schottky junction with the n-type operating layer 102, is provided. This element is isolated from other neighboring elements by an insulated layer 125 formed by impurity implantation. In this case, since the surface of the protecting element 200 that is integrated on the same chip is an n-type epitaxial layer, the area between first and second n+-type regions is formed as the insulated region 203b by impurity injection. The outer sides of the respective terminals are likewise isolated by the insulated layer 125, formed by impurity implantation. The insulated region 203b of the protecting element and the insulated layer 125 for element isolation are preferably formed in the same process. Also, the first and the second n+-type regions 201 and 202 are preferably formed at the same time as the source and drain regions of the operating region 108. The protecting element has a first n+-type region 201—insulated region 203b—second n+-type region 202 structure. In this case, the protecting element protects the gate Schottky junction from electrostatic breakdown.

Though not illustrated, the same arrangement as that of FIG. 7(B) may be considered for a junction type FET with which a p+-type gate region is formed in the n-type epitaxial operating layer and a gate electrode with ohmic junction with this region is provided. In this case, the protecting element protects the gate PN junction from electrostatic breakdown.

Figure 7D:
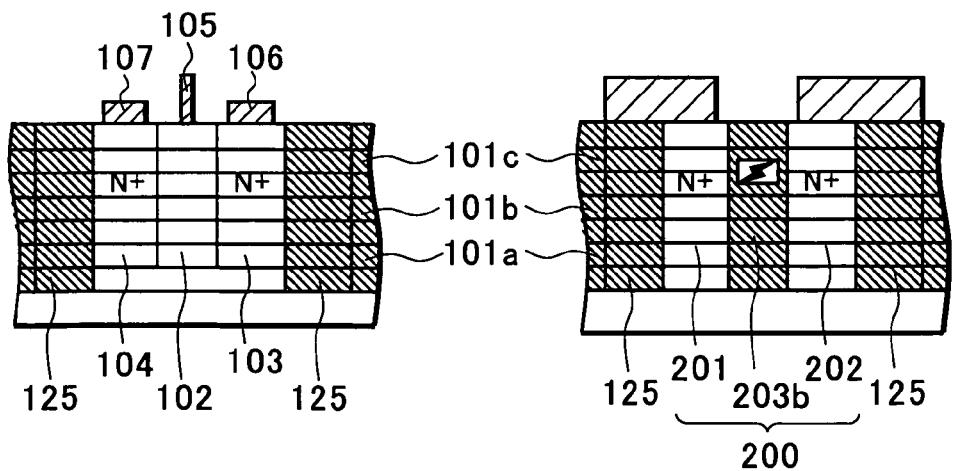
FIG. 7(D) is a sectional view for describing this invention.

Besides MESFET's and junction type FET's, an HEMT (High Electron Mobility Transistor) is also possible, as shown in FIG. 7(D).

This is a structure wherein a n++AlGaAs layer 101a, an undoped InGaAs layer 101b, and a n++AlGaAs layer 101c are formed as epitaxial layers successively on the semi-insulating substrate 101. The source electrode 106 and the drain electrode 107 are disposed as ohmic electrodes above the source region 103 and the drain region 104, formed by n+-type ion implantation at the respective ends of the operating layer 102, which is formed of the plurality of layers, and the gate electrode 105 that forms Schottky junction with the operating layer surface is provided. This element is isolated from other neighboring elements by the insulated layer 125 formed by impurity injection. Also, as shown at the right diagram of FIG. 7(D), since the surface of the protecting element 200 that is integrated on the same chip has the same substrate structure, the protecting element has a structure in which the insulated region 203b is disposed between the first and the second n+-type regions that are formed at the same time as the source region 103 and the drain region 104. Furthermore, the outer sides of the respective terminals are likewise isolated by the insulated layer 125, formed by impurity implantation. The insulated region 203b of the protecting element and the insulated layer 125 for element isolation are preferably formed in the same process. Also, the first and second n+-type regions are preferably formed at the same time as the source and drain regions of the operating region 108. In this case, the protecting element protects the gate Schottky junction from electrostatic breakdown.

Although an example of connecting protecting elements between the gate terminal G and the source terminal S and between gate terminal G and drain terminal D was described here since, with an FET, a gate Schottky junction or a gate PN junction is weakest against electrostatic breakdown, a protecting element may be connected in parallel between the source terminal S and the drain terminal D instead.

Figure 8A:
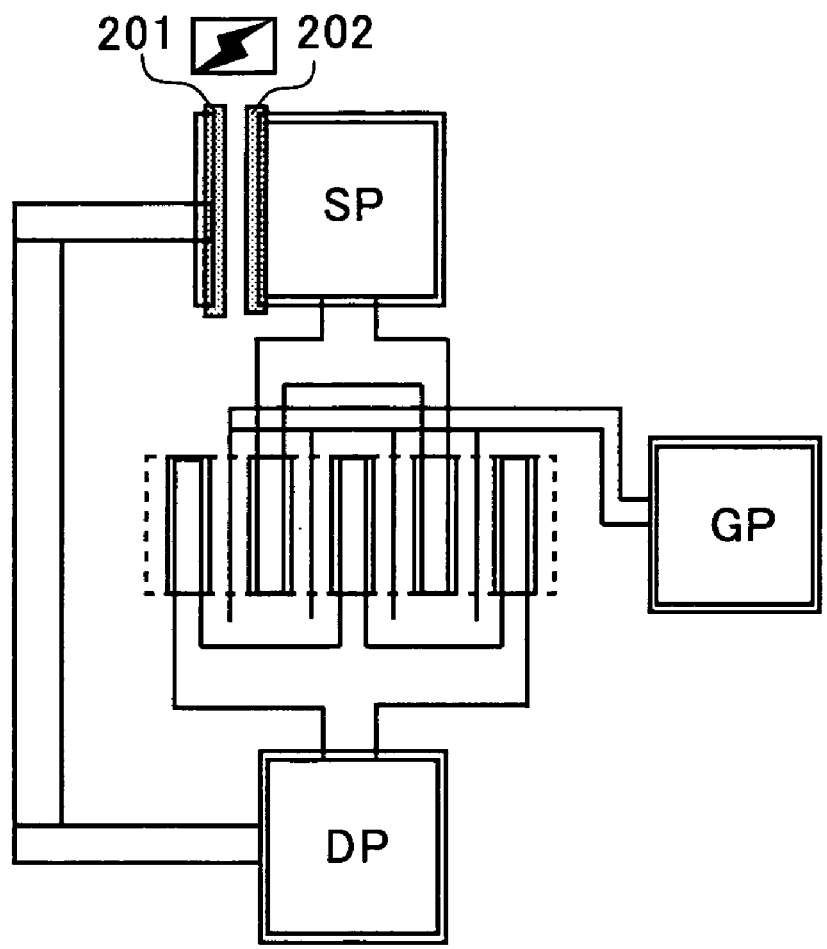
FIG. 8(A) is a plan view for describing this invention.

FIG. 8 shows schematic diagrams of such a case. This connection example is just one example. In the case of this example, the second n+-type region 202 is made as the terminal of the protecting element 200 that is connected to the source pad SP and the first n+-type region 201 is made as the terminal of the protecting element 200 that is connected to the drain pad DP. The second n+-type region is placed at the periphery of the pad and the source pad SP is used as metal electrode 204.

Figure 8B:
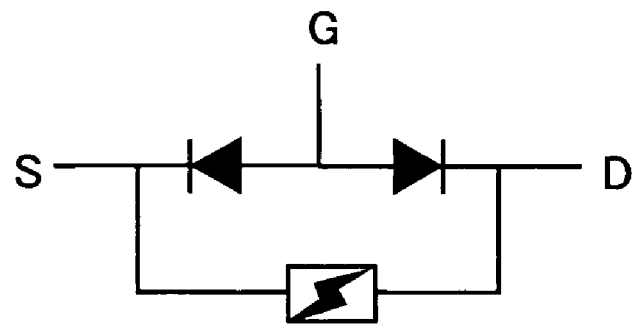
FIG. 8(B) is an equivalent circuit diagram view for describing this invention.

FIG. 8(B) shows the equivalent circuit diagram for this case. Here, an equivalent circuit, wherein a Schottky barrier diode between the gate terminal G and the source terminal S and a Schottky barrier diode between the gate terminal G and the drain terminal D are connected in series, is protected. This protecting element connection is effective for example in a case where both the source electrode and drain electrode are used as input and output terminals serving as entrance and exit for signals as in a switching circuit device.

In general, GaAs MESFETs are used in satellite broadcasting, cellular phones, wireless broadband applications, and other microwave applications of the GHz band or higher frequency. Thus in order to secure good microwave characteristics, the gate length is of the submicron order and the gate Schottky junction capacitance is designed to be extremely small. GaAs MESFETs were thus extremely weak against electrostatic breakdown and the finest care was necessary for handling devices including MMICs in which GaAs MESFETs are integrated. Furthermore, protecting diodes, which are widely employed for increasing the electrostatic breakdown voltage in general, consumer-use semiconductors for low frequency applications, such as audio, video, and power supply applications, have a pn junction and use thereof thus causes the parasitic capacitance to increase greatly by at least a few hundred fF or more. Such protecting diodes thus greatly degrade the microwave characteristics of a GaAs MESFET and therefore cannot be used.

However, since this invention's electrostatic breakdown protecting element does not have a pn junction and is of a capacitance of at most a few dozen fF or less, it can greatly improve the electrostatic breakdown voltage without degrading the microwave characteristics of a GaAs MESFET.

A second embodiment of this invention shall now be described with reference to FIGS. 9 and 10.

The second embodiment is an example of a switching circuit device that uses FET's that are connected to the protecting element 200.

Figure 9:
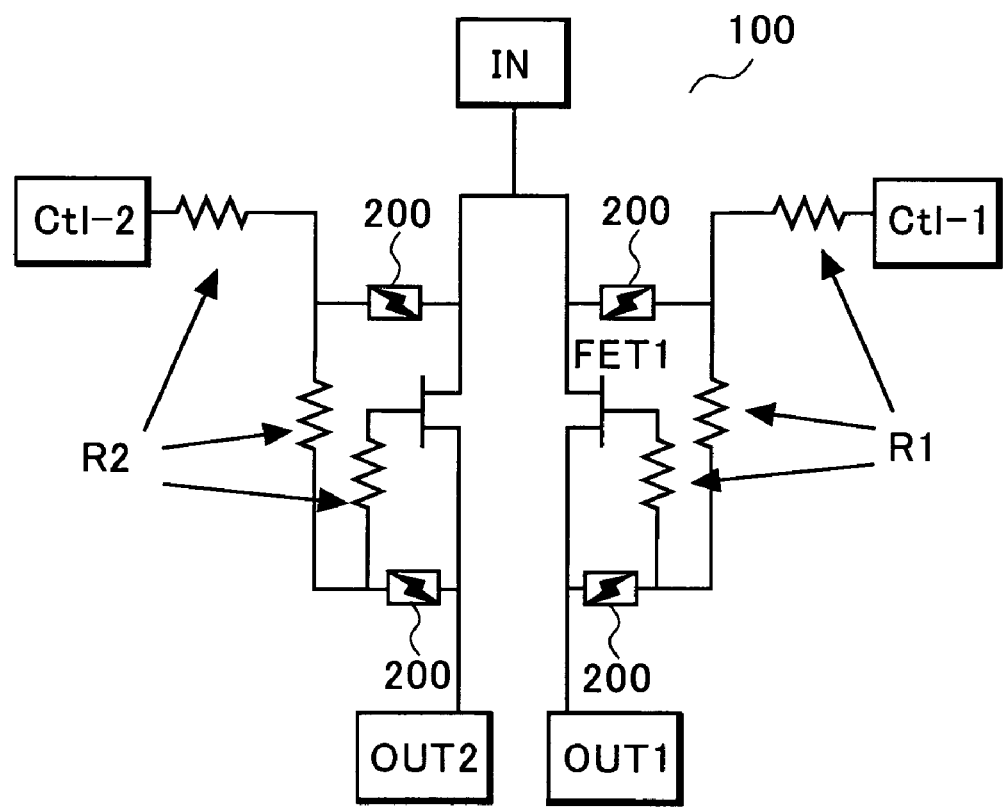
FIG. 9 is an equivalent circuit diagram view for describing this invention.

FIG. 9 shows a circuit diagram indicating compound semiconductor switching circuit device, which is a protected element. The source electrodes (or drain electrodes) of first and second FET's, FET1 and FET2, are connected to the common input terminal IN, the gate electrodes of FET1 and FET2 are connected to the first and the second control terminals Ctl-1 and Ctl-2, respectively, via resistors R1 and R2, respectively, and the drain electrodes (or source electrodes) of FET1 and FET2 are connected to the first and the second output terminals OUT1 and OUT2, respectively. The control signals that are applied to the first and the second control terminals Ctl-1 and Ctl-2 are complementary signals and the FET to which the H level signal is applied turns ON to make the input signal applied to the common input terminal IN be transmitted to one of the output terminals. Resistors R1 and R2 are placed to prevent high-frequency signals from leaking via the gate electrodes to the DC potential of the control terminals Ctl-1 and Ctl-2, which are AC grounded.

Figure 13:
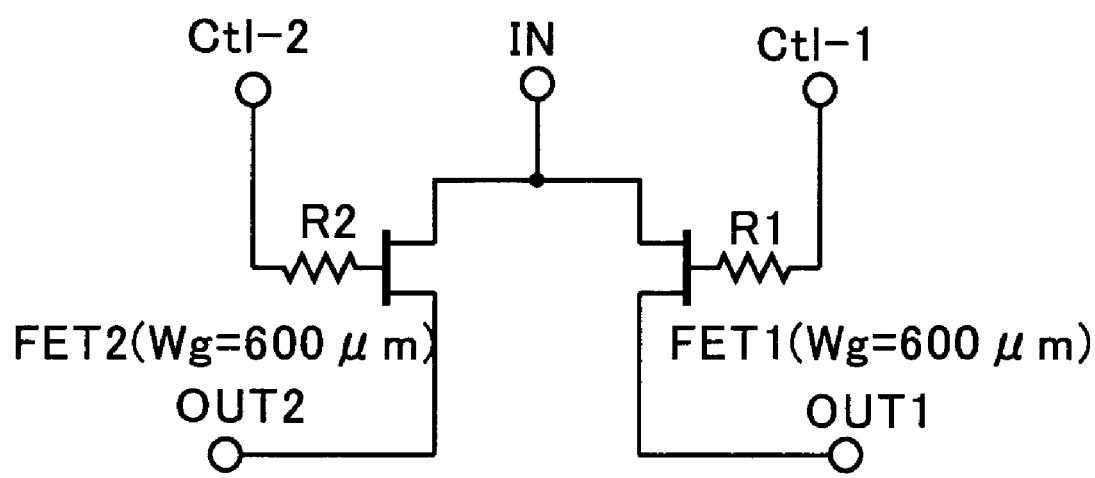
FIG. 13 is an equivalent circuit diagram for describing a conventional example.

With the circuit shown in FIG. 9, the protecting elements 200 are connected in parallel between the gate and source terminals and between the gate and drain terminals of each of the two FET's of the compound semiconductor switching circuit device, which is shown in FIG. 13, uses GaAs FET's, and is called an SPDT (Single Pole Double Throw). The control terminal Ctl-1 is connected to the gate electrode of FET1, the control terminal Ctl-2 is connected to the gate electrode of FET2, and the protecting elements 200 are connected respectively between Ctl-1 and IN, between Ctl-2 and IN, between Ctl-1 and OUT1, and between Ctl-2 and OUT2.

Figure 10A:
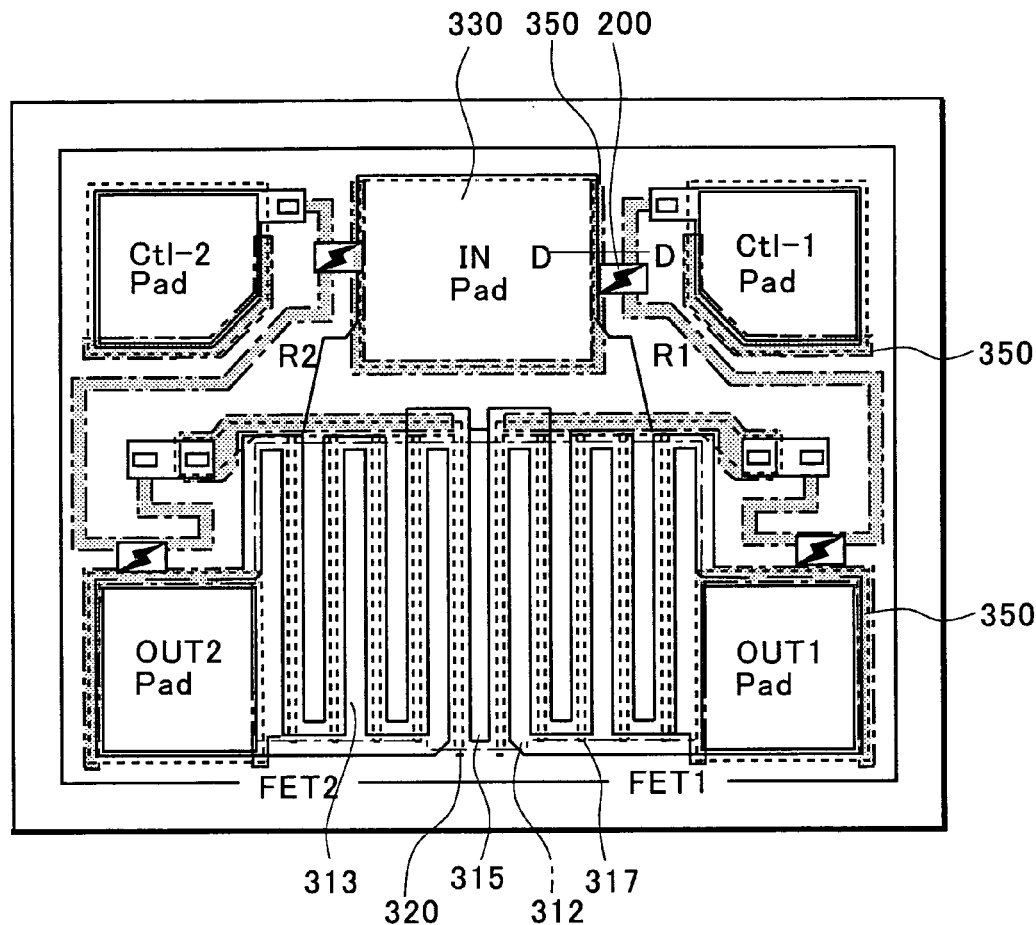
FIG. 10(A) is a plan view for describing this invention.
Figure 10B:
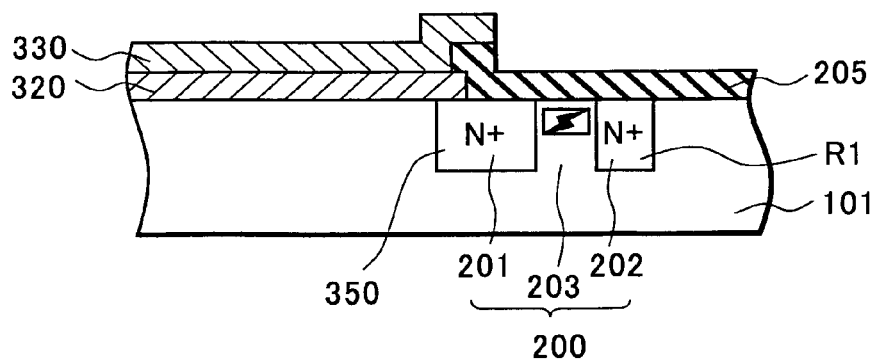
FIG. 10(B) is a sectional view for describing this invention.

FIG. 10 shows a plan view of an arrangement in which the switching circuit device shown in FIG. 9 is integrated in a single chip.

FET1 and FET2, which perform switching, are disposed at central parts of the GaAs substrate 101 and resistors R1 and R2 are connected to the respective gate electrodes 317 of the FET's. Also, pads INPad, OUT1Pad, OUT2Pad, Ctl-1Pad, and Ctl-2Pad, respectively corresponding to the common input terminal IN, the output terminals OUT1 and OUT2, and the control terminals Ctl-1 and Ctl-2, are disposed at the surroundings of FET1 and FET2, respectively, at peripheral parts of the substrate. A gate metal layer (Ti/Pt/Au) 320, which is formed at the same time as the forming of the gate electrodes 317 of the respective FET's, is a second-layer wiring, indicated by dotted lines, and a pad metal layer (Ti/Pt/Au) 330, which connects the respective elements and form the pads, is a third-layer wiring, indicated by solid lines. An ohmic metal layer (AuGe/Ni/Au), which is the first layer in ohmic contact with the substrate, forms the source electrodes and drain electrodes of the respective FET's and take-out electrodes at the ends of the respective resistors, and this layer is not illustrated in FIG. 10 as it overlaps with the pad metal layer.

FET1, shown in FIG. 10, is formed on an operating region 312, which is surrounded by alternate long and short dash lines. The three third-layer pad metal layer 330 parts, which take on the form of comb teeth that extend from the lower side, are a source electrode 313 (or drain electrode) connected to the output terminal OUT1, and below this is disposed the source electrode (or drain electrode) formed by the first-layer ohmic layer. Also, the three third-layer pad metal layer 330 parts, which take on the form of comb teeth that extend from the upper side, are a drain electrode 315 (or source electrode) connected to common input terminal IN, and below this is disposed the drain electrode (or source electrode) formed by the first-layer ohmic metal layer. These electrodes are disposed in the form of engaged comb teeth and in between these, the gate electrode 317, formed from the second-layer gate metal layer 320, is disposed on the operating region 312 in the form of five comb teeth. The drain electrode 315 (or source electrode) that takes on the form of the central comb tooth that extends from the upper side is used in common by FET1 and FET2 to further contribute to size reduction. Here, that the gate width is 600 μm means that the total gate width of the comb-teeth-like gate electrode 317 of each FET is 600 μm.

The gate electrode and the control terminal Ctl-1 of FET1 are connected by the resistor R1 and the gate electrode and the control terminal Ctl-2 of FET2 are connected by the resistor R2. The resistor R1 and the resistor R2 are n+-type impurity diffusion regions that are disposed on the substrate.

As described above, with an FET, the part of minimum electrostatic breakdown voltage is the Schottky junction part between the gate terminal G and the operating layer 102. That is, when the electrostatic energy applied between the gate and drain terminals or between the gate and source terminals reaches at the gate Schottky junction, and the electrostatic energy that reaches this part exceeds the electrostatic breakdown voltage between the gate electrode and the source electrode or between the gate electrode and the drain electrode, the gate Schottky junction breaks down.

Here, since FET1 side and FET2 side are symmetrical and are exactly the same, a description shall be provided with FET1 side as an example. With the conventional-art switching circuit device shown in FIG. 14, the electrostatic breakdown voltage is 140 V and the lowest between the common input terminal IN and the control terminal Ctl-1. The electrostatic energy should thus be attenuated before and in the process in which the electrostatic energy applied between the common input terminal IN and the control terminal Ctl-1 reaches between the gate electrode 317 and drain electrode 315 or between the gate electrode 317 and source electrode 313 in FET1.

Though the increasing of the resistance value of the R1 may be considered as a method of attenuating the electrostatic energy, if the R1 is made too large, the switching time of the switching circuit device becomes too long. Thus in this embodiment, the electrostatic energy is attenuated using the protecting elements 200.

Here, as mentioned above, the resistor R1 is formed as an n+-type impurity region. Also, as an isolation measure for preventing the leakage of high-frequency signals from the respective pads, pad peripheral n+ regions 350, which are third high-concentration impurity regions, are disposed at the surroundings of the respective pads. As shown in the sectional view of FIG. 10(B), the lowermost gate metal layer 320 of each pad forms a Schottky junction with the GaAs semi-insulating substrate and the peripheral n+ region 350 forms a Schottky junction with each pad.

That is, by positioning the resistor R1 close to the common input terminal pad INPad, the n+-type region that makes up the resistor R1 and the pad peripheral n+-type region 350 become 4 μm in distance, thus forming a protecting element 200 across semi-insulating substrate 101. A part of the resistor R1 is the first n+-type region 201 and a part of n+-region of the periphery of the common input terminal pad INPad is the second n+-type region 202. This layout is thus equivalent to connecting the protecting element 200 in parallel between the common input terminal IN and the control terminal Ctl-1, that is, between the source and gate terminals (or between drain and gate terminals) of FET1.

The connection can be made within a path from a control terminal pad, which is close to the common input terminal pad INPad and to which a signal is applied, to an operating region. Electrostatic energy applied to the switching circuit device can thus be attenuated prior to reaching the operating region.

Here, the protecting element 200 can attenuate a greater amount of electrostatic energy when the length by which it is placed adjacent along a pad is longer, and this length is thus preferably 10 μm or more. Though in FIG. 10, the protecting element 200 is illustrated as being placed along a side of the common input terminal pad INPad, for example by changing the configuration of the resistor R1 and configuring it in an L-shape along two sides of the common input terminal pad INPad, the protecting element 200 can be made longer in the length along which it is placed adjacent the pad and can thus be made more effective for the attenuation of electrostatic energy.

Though details shall be provided later, by connecting the protecting elements 200 in parallel between the common input terminal IN and the control terminal Ctl-1 and between the common input terminal IN and the control terminal Ctl-2 of the switching circuit device as described above, the electrostatic breakdown voltage between these terminals can be raised up to 700 V.

In a case where there is no resistor between a gate electrode and a gate pad as in the first embodiment, for an FET with a gate length of 0.5 μm and gate width of 600 μm, the electrostatic breakdown voltage across a gate and source or across a gate and drain is measured to be no more than approximately 50V. A gate Schottky junction on an operating region of an FET thus in itself has an electrostatic breakdown voltage of an actual value of no more than approximately 50 V.

The FET of the second embodiment also has a gate length of 0.5 μm and gate width of 600 μm, and normally, the electrostatic breakdown voltage of the gate Schottky junction of this FET will also be no more than approximately 50V. However, in a switching circuit device, the resistors R1 and R2 always exist between a gate electrode and a gate pad (control terminal pad, in this case), such as those of the second embodiment. Since a part of the electrostatic energy is consumed as heat in these resistors R1 and R2, measurement of the electrostatic breakdown voltage between the common input terminal IN and the control terminal Ctl-1 (or likewise between the common input terminal IN and the control terminal Ctl-2) of the switching circuit device shows the electrostatic breakdown voltage to be improved somewhat to approximately 100V or less, even if the protecting element 200 is not connected.

Furthermore, when the protecting element 200 is connected in parallel, the electrostatic energy is bypassed to and discharged in the protecting element 200. Thus even if electrostatic energy of an amount that is discharged by the protecting element 200 is applied additionally between the common input terminal IN and the control terminal Ctl-1, the operating region 312 will not undergo electrostatic breakdown and thus the measured value of the electrostatic breakdown voltage is increased to 200V or more by the amount discharged by the protecting element 200.

In other words, the electrostatic energy that is applied between the common input terminal IN and the control terminal Ctl-1 is consumed partially as heat in the resistor R1, consumed further by discharge by the protecting element 200, and thus attenuated to less than the breakdown voltage of the operating region 312 by the time it reaches the operating region 312.

Figures 11, 12:
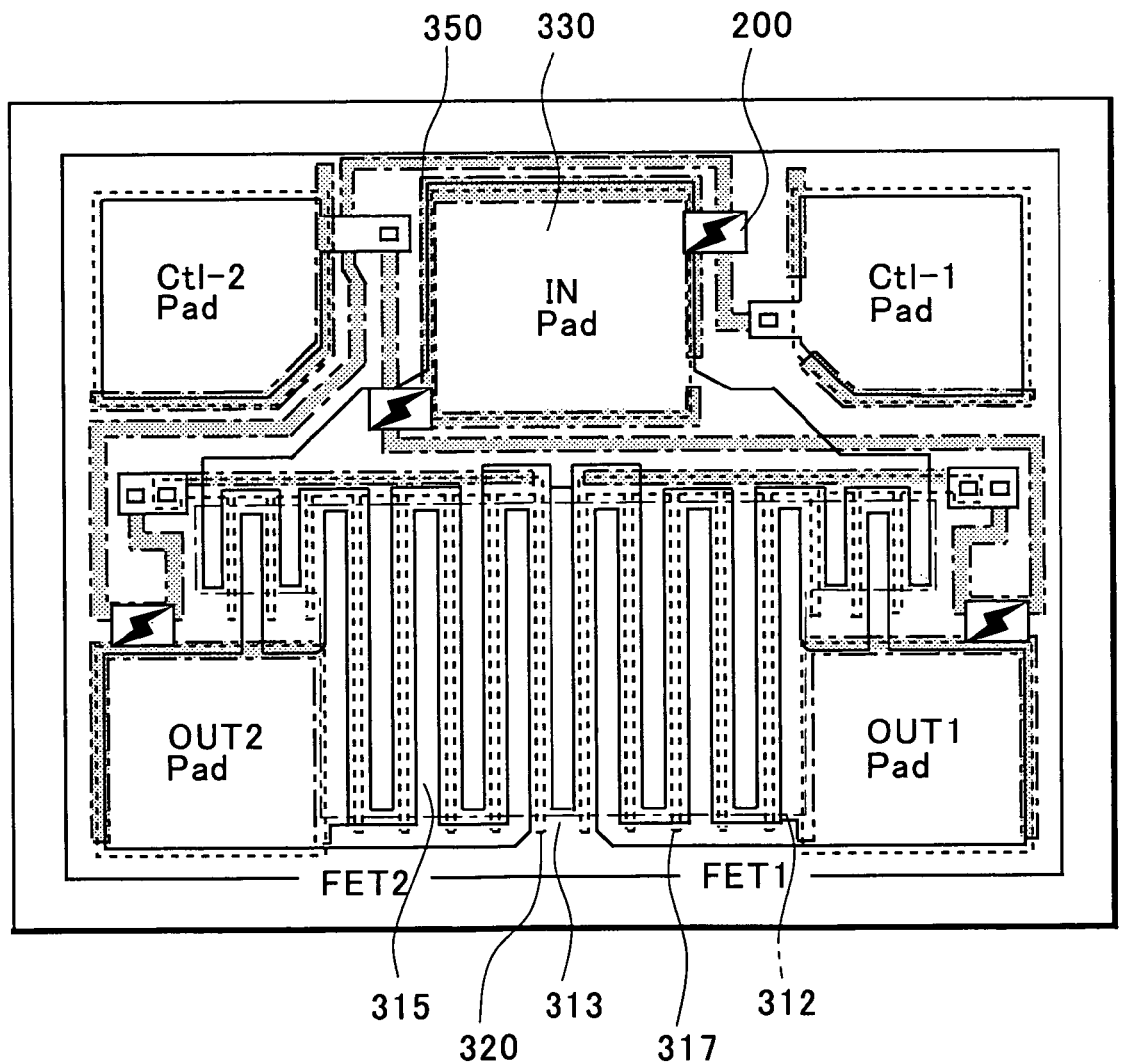
FIG. 11 is a characteristics diagram for describing this invention.
FIG. 12 is a plan view of this invention.

FIG. 11 shows the results of measuring the electrostatic breakdown voltage of the switching circuit device of FIG. 10, which is the second embodiment. Here, the electrostatic breakdown voltage between the common input terminal IN and the control terminal Ctl-1 and that between the common input terminal IN and the control terminal Ctl-2 are both 700 V and are thus increased greatly in comparison to the 140V between the same terminals in the conventional-art case.

The mechanism for the above shall now be described for a case where the actual value of the electrostatic breakdown voltage of the operating region 312 of the FET is 50 V.

Figures 14, 15:
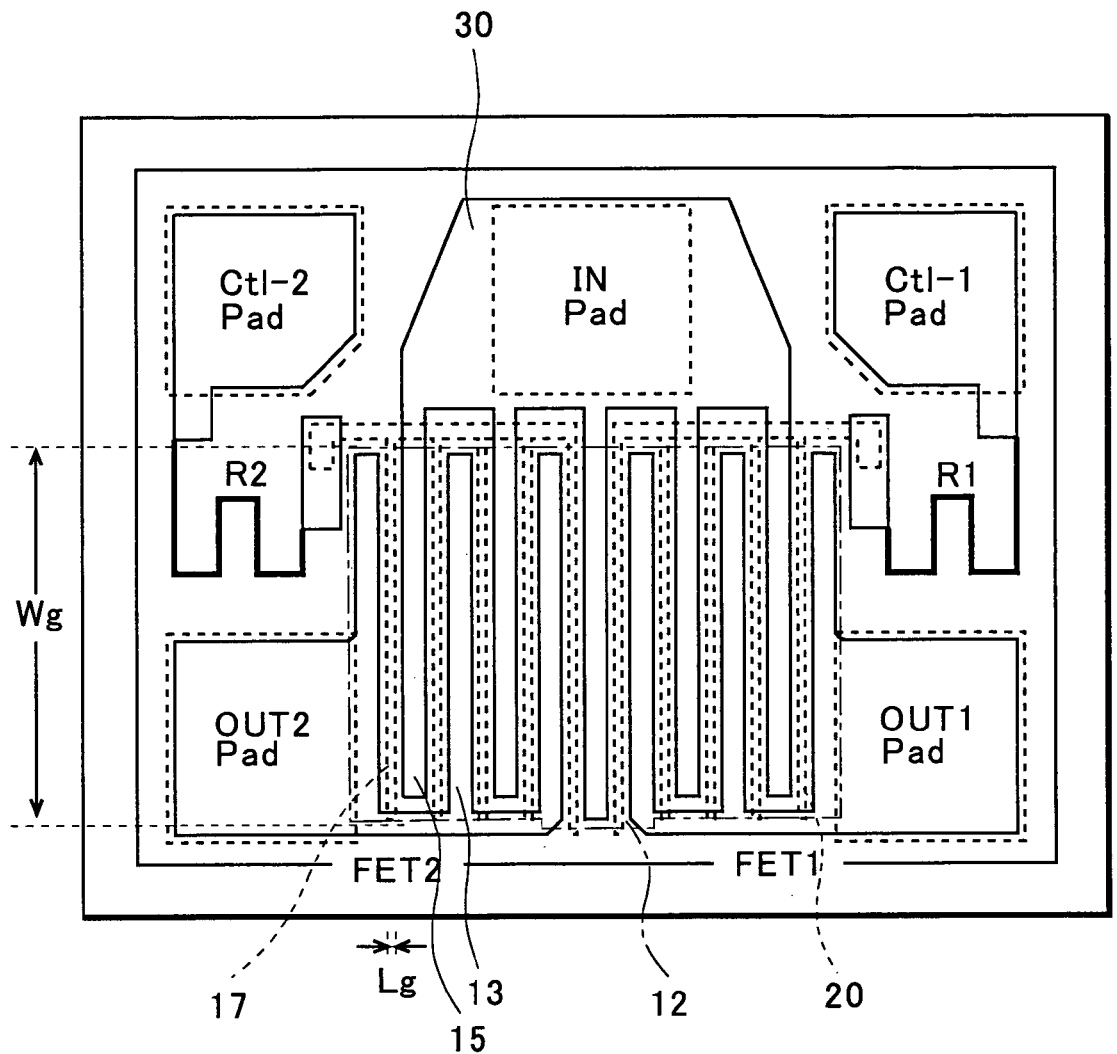
FIG. 14 is a plan view for describing a conventional-art example.
FIG. 15 is a characteristics diagram for describing a conventional-art example.

As mentioned above, the operating region 312 of the FET breaks down at 50 V. Also, with the conventional art, the electrostatic breakdown voltage between the common input terminal IN and the control terminal Ctl-1 is 140V as shown in FIG. 15. This is the value for the case where the protecting element 200 is not provided and the electrostatic energy applied between the common input terminal IN and the control terminal Ctl-1 reaches the operating region 312 upon being attenuated partially by the resistor R1. That is, electrostatic energy of an amount corresponding to 140−50=90 V is consumed as heat in the resistor R1 between the gate electrode 317 and the control terminal pad Ctl-1 Pad, and the Schottky junction breaks down at the point at which 50V is applied to the operating region 312 of the FET.

With the second embodiment, the measurement of the electrostatic breakdown voltage between the common input terminal IN and the control terminal Ctl-1 shows that breakage occurs at 700 V as shown in FIG. 11. The Schottky junction of the operating region 312 of the FET breaks down at 50 V, the electrostatic energy that is consumed as heat in the resistor R1 between the gate electrode 317 and the control terminal pad Ctl-1Pad is of an amount corresponding to 90 V, and these are the same as those of the conventional art.

That is, electrostatic energy of an amount corresponding to 700−50−90=560 V is discharged in the protecting element 200, and this amount is thus consumed as heat. That is, with the pattern of the second embodiment, since an amount (560 V) that exceeds the amount corresponding to the electrostatic breakdown voltage of the Schottky junction of the operating region 312 plus the amount attenuated by the resistor R1 can be discharged in the protecting element 200 and the electrostatic energy can be attenuated before it reaches the operating region 312, the electrostatic breakdown voltage can be said to be improved to 700 V.

Here, below the peripheral end parts of the pad of the common input terminal INPad, of the pads of the control terminals Ctl-1 and Ctl-2, of the pads of the output terminals OUT1 and OUT2, and also of gate electrodes on the area other than the operating regions 312 of the two FET's, the peripheral n+-type regions 350 are provided as indicated by alternate long and short dash lines. Peripheral n+-type regions 350 may be provided not just at peripheral end parts but also over the entire surfaces directly below respective pads and gate electrodes on the area other than the operating regions 312 of the two FET's. Furthermore, the peripheral n+-type regions 350 may be provided adjacent to and at peripheral parts of and not provided directly below, the pad of the common input terminal INPad, the pads of the control terminals Ctl-1 and Ctl-2, the pads of the output terminals OUT1 and OUT2 and the gate electrodes on the area other than the operating regions 312 of the two FET's. These peripheral n+-type regions 350 are formed at the same time as when the source and drain regions are formed and the distance of parts at which these peripheral n+-type regions 350 and the resistors R1 and R2 are adjacent each other is 4 μm.

That is, in the same chip a plurality of the protecting elements 200 may be connected where these peripheral n+-type regions 350 and the resistors R1 and R2 are used as terminals of the protecting elements 200. The terminals of the protecting elements 200 may be connected to bonding pads via metal electrodes or may be the wiring of the resistors R1 and R2, etc., themselves that connect the bonding pads with the operating regions 312.

In FIG. 10, for example at FET1 side, the resistor R1 is disposed so as to pass in the vicinity of the common input terminal pad INPad and the output terminal pad OUT1 pad. The protecting elements 200 are thereby connected both between the gate and drain terminals and between the gate and source terminals of FET1 to enable the minimum electrostatic breakdown voltage of the switching circuit device to be improved.

As shown in FIG. 11, the electrostatic breakdown voltage between the control terminal Ctl-1 and the output terminal OUT1 and that between the control terminal Ctl-2 and the output terminal OUT2 are both 330V. Much of the details of the mechanism that determine the electrostatic breakdown voltage are still unknown and the reasons why the electrostatic breakdown voltages between these terminals are reduced in comparison to those of the conventional art are not clear. However, since the electrostatic breakdown voltage of the protected element as a whole is governed by the lowest of the electrostatic breakdown voltages among all parings of the terminals of the protected element, an important point is how much this minimum electrostatic breakdown voltage can be increased.

In this embodiment, by connecting the protecting elements 200 in parallel between the common input terminal IN and the control terminal Ctl-1 and between the common input terminal IN and the control terminal Ctl-2, where the electrostatic breakdown voltage was lowest in the conventional art, the electrostatic breakdown voltage can be improved to 700V.

In addition, by also connecting the protecting elements in parallel between the control terminal Ctl-1 and the output terminal OUT1 and between the control terminal Ctl-2 and the output terminal OUT2, the minimum electrostatic breakdown voltage of 140V is improved to 330V, thus providing the effect of improving the electrostatic breakdown voltage of the switching circuit device as a whole.

FIG. 12 shows a third embodiment. FIG. 12 shows the circuit design of a reverse control type logic pattern of the compound semiconductor switching circuit device of FIG. 10, and here the control terminal Ctl-1 is connected to the gate electrode of FET2 and the control terminal Ctl-2 is connected to the gate electrode of FET1.

With the logic of this switching circuit, when a signal is to be passed to output terminal OUT1, 3V for example is applied to the control terminal Ctl-2, which is further from the output terminal OUT1, and 0V is applied to the control terminal Ctl-1, and oppositely when a signal is to be passed to the output terminal OUT2, a bias signal of 3V is applied to the control terminal Ctl-1, which is further from the output terminal OUT2, and 0V is applied to the control terminal Ctl-2.

With this reverse control type switching circuit device, the protecting element 200 is connected between the input terminal IN and the control terminal Ctl-2. The electrostatic breakdown voltage between the two terminals, which was the electrostatic breakdown voltage of the lowest value of, for example, 80 V prior to connection, can be improved up to 270 V.

Also, by connecting the protecting elements 200 between the gate and drain terminals of FET1 (between Ctl-2 and IN), between the gate and source of FET1 (between Ctl-2 and OUT1), between the gate and drain of FET 2 (between Ctl-1 and TN), and between the gate and source of FET2 (between Ctl-1 and OUT2) as shown in the figure, the minimum electrostatic breakdown voltage of the switching circuit, which was conventionally 80 V, can be improved to 270 V.

Here, the common input terminal pad INPad is a pad common for the two FET's, FET1 and FET2, and each control terminal is connected to the FET that is positioned further away. Thus for example, the resistors R1 and R2, which are the connection means, are disposed close to the four sides, as total, of the input terminal pad INPad in respectively L-shaped forms. That is, the structure is such that two protecting elements 200 are respectively connected in L-shaped forms along the input terminal pad INPad.

Each of a plurality of the protecting elements 200 may thus be positioned along at least one side of the same pad.

The connection examples of the above-described embodiments are just a part of the examples. In a case where pads neighbor each other, the respective terminals of the protecting element may be n+ regions that are directly connected to pads. That is, the connection is defined only by the description of the claims.

As described in detail above, the preferred embodiment of this invention provides the following various effects.

Firstly, by connecting a protecting element, formed of a high concentration region—insulating region—high concentration region, in parallel between terminals that connect an especially weak junction in an FET containing a PN junction or Schottky junction that tends to break readily by electrostatic breakdown, electrostatic energy that is applied from the exterior can be bypassed. Since the electrostatic energy is thus discharged in the protecting element at the path leading to the operating region of the FET, the electrostatic energy, which reaches to the electrodes on the operating region corresponding to the terminals between which the protecting element is connected, is attenuated and the FET can be protected against electrostatic breakdown.

Secondly, since the protecting element has a high concentration impurity region—insulating region—high concentration impurity region structure and does not have a PN junction, the parasitic capacitance of the protecting element itself will not arise. The protecting element can thus be formed on the same substrate as the protected element with hardly any increase in parasitic capacitance and the electrostatic breakdown can thus be prevented without degradation of high-frequency characteristics.

Thirdly, by connecting a protecting element adjacent a pad connected to a terminal of the protected element, electrostatic energy can be discharged immediately after its application, thereby contributing further to the improvement of the electrostatic breakdown voltage.

Fourthly, by connecting a protecting element in the middle of the path from a bonding pad connected to a terminal of a protected element to an operating region, a junction or a capacitance that is weak against electrostatic breakdown can be protected most effectively from electrostatic breakdown.

Fifthly, in a switching circuit device, by connecting a protecting element in parallel between a common input terminal and a control terminal, which conventionally had the minimum electrostatic breakdown voltage, the electrostatic breakdown voltage between the common input terminal and the control terminal can be improved greatly.

Sixthly, in a switching circuit device, by also connecting a protecting element in parallel between a control terminal and an output terminal, the effect of improving the minimum electrostatic breakdown voltage of the switching circuit device as a whole is provided.

Seventhly, since unlike a protecting diode, with which electrostatic energy is discharged at the horizontal plane, electrostatic energy is discharged at the vertical plane with a protecting element, integration of the protecting element can be carried out while causing hardly any increase in the chip area.

100 protected element
101 substrate
102 operating layer
103 source region
104 drain region
105 gate electrode
106 source electrode
107 drain electrode
112 gate wiring
113 source wiring
114 drain wiring
115 diode
120 wiring
125 insulated layer
200 protecting element
201 first $n^+$-type region
202 second $n^+$-type region
203 insulating region
203a semi-insulating region
203b insulated region
204 metal electrode 205 insulating film
206 metal layer
312 operating region
313 source electrode
315 drain electrode
317 gate electrode
320 gate metal layer
330 pad metal layer
350 peripheral n$^+$-type region
S source terminal
D drain terminal
G gate terminal
SP source pad
DP drain pad
GP gate pad
IN common input terminal
Ctl-1 control terminal
Ctl-2 control terminal
OUT1 output terminal
OUT2 output terminal
INPad common input terminal pad
Ct1-1Pad control terminal pad
Ctl-2Pad control terminal pad
OUT1Pad output terminal pad
OUT2Pad output terminal pad

What is claimed is:

1. A semiconductor device, comprising:
a field effect transistor formed on a semi-insulating substrate and comprising a gate electrode, a source electrode and a drain electrode;
a bonding pad formed on the semi-insulating substrate and connected to the gate electrode, the source electrode or the drain electrode; and
a protecting element for the transistor formed on the semi-insulating substrate and connected between the bonding pad and a terminal of one of the electrodes that is not connected to the bonding pad, the protecting element comprising a first high concentration impurity region, a second high concentration impurity region and an insulating region disposed between the first and second high concentration impurity regions and being configured to permit current flow between the first and second high concentration impurity regions upon application between the bonding pad and the terminal of an electrostatic energy that is larger than a predetermined amount,
wherein the first high concentration impurity region is closer to the bonding pad than the second high concentration impurity region, electrically disconnected from the bonding pad except during the application of the electrostatic energy, physically separated from the bonding pad so as to form a Schottky junction between the bonding pad and a portion of the semi-insulating substrate in which the first high concentration impurity region is not formed, and configured to be electrically connected to the bonding pad through the Schottky junction so as to permit the current flow upon the application of the electrostatic energy.

2. The semiconductor device of claim 1, wherein the first high concentration impurity region is disposed along at least one side of the bonding pad.

3. The semiconductor device of claim 1, further comprising a peripheral high concentration impurity region disposed at a peripheral area of the bonding pad, wherein the first high concentration impurity region is part of the peripheral high concentration impurity region.

4. The semiconductor device of claim 1, wherein the protecting element is placed in a path extending from the terminal to an operation region of the field effect transistor.

5. The semiconductor device of claim 1, further comprising:
an additional bonding pad provided as the terminal; and
a resistor connected to the additional bonding pad and comprising a resistor high concentration impurity region,
wherein the second high concentration impurity region is at least part of the resistor high concentration impurity region.

6. The semiconductor device of claim 1, further comprising an additional protecting element for the transistor connected between the bonding pad and another terminal of the electrodes that is not connected to the bonding pad, the additional protecting element comprising a first additional high concentration impurity region, a second additional high concentration impurity region and an additional insulating region disposed between the first and second additional high concentration impurity regions and the additional protecting element being configured to permit current flow between the first and second additional high concentration impurity regions upon application between the bonding pad and the another terminal of an electrostatic energy that is larger than a predetermined amount, wherein the protecting element is disposed along a side of the bonding pad and the additional protecting element is disposed along another side of the bonding pad.

7. The semiconductor device of claim 1, further comprising:
an additional field effect transistor comprising a gate electrode, a source electrode and a drain electrode; and
an additional protecting element connected between the bonding pad and a terminal of one of the electrodes of the additional field effect transistor, the additional protecting element comprising a first additional high concentration impurity region, a second additional high concentration impurity region and an additional insulating region disposed between the first and second additional high concentration impurity regions and the additional protecting element being configured to permit current flow between the first and second additional high concentration impurity regions upon application of an electrostatic energy that is larger than a predetermined amount between the bonding pad and the terminal of the additional filed effect transistor,
wherein the protecting element is disposed along a side of the bonding pad and the additional protecting element is disposed along another side of the bonding pad.

8. The semiconductor device of claim 1, further comprising:
an additional bonding pad provided as another terminal of the electrodes; and
an additional protecting element for the transistor connected between the terminal and the additional bonding pad, the additional protecting element comprising a first additional high concentration impurity region, a second additional high concentration impurity region and an additional insulating region disposed between the first and second additional high concentration impurity regions and the additional protecting element being configured to permit current flow between the first and second additional high concentration impurity regions upon application between the terminal and the additional bonding pad of an electrostatic energy that is larger than a predetermined amount, wherein at least part of the first additional high concentration impurity region is disposed under the additional bonding pad or in close proximity to the additional bonding pad to permit the current flow upon the application of the electrostatic energy.

9. The semiconductor device of claim 8, wherein the protecting element and the additional protecting element are placed in a path extending from the terminal to an operation region of the field effect transistor.

10. A semiconductor switching device, comprising:
a first field effect transistor comprising a gate electrode, a source electrode and a drain electrode;
a second field effect transistor comprising a gate electrode, a source electrode and a drain electrode;
a common input terminal connected to the source or drain electrode of the first transistor and to the source or drain electrode of the second transistor;
a first control terminal connected to the gate electrode of the first or second transistor;
a second control terminal connected to the gate electrode of the first or second transistor that is not connected to the first control terminal;
a first resistor connecting the first control terminal and a corresponding gate electrode and comprising a first resistor high concentration impurity region;
a second resistor connecting the second control terminal and a corresponding gate electrode and comprising a second resistor high concentration impurity region;
a first output terminal connected to the source or drain electrode of the first transistor that is not connected to the common input terminal;
a second output terminal connected to the source or drain electrode of the second transistor that is not connected to the common input terminal; and
a protecting element connected between the common input terminal and the first control terminal, the protecting element comprising a first high concentration impurity region, a second high concentration impurity region and an insulating region disposed between the first and second high concentration impurity regions and being configured to permit current flow between the first and second high concentration impurity regions upon application between the common input terminal and the first control terminal of an electrostatic energy that is larger than a predetermined amount, the first high concentration impurity region being at least part of the first resistor high concentration impurity region, the first and second high concentration impurity regions being electrically disconnected from each other except during the application of the electrostatic energy, and no electrical wiring existing between the first and second high concentration impurity regions,
wherein the common input terminal comprises a bonding pad,
a peripheral high concentration impurity region is disposed at a peripheral area of the bonding pad, and
the second high concentration impurity region is part of the peripheral high concentration impurity region.

11. The semiconductor switching device of claim 10, further comprising an additional protecting element connected between the first control terminal and the first output terminal or between the second control terminal and the second output terminal, the additional protecting element comprising a first additional high concentration impurity region, a second additional high concentration impurity region and an additional insulating region disposed between the first and second additional high concentration impurity regions and the additional protecting element being configured to permit current flow between the first and second additional high concentration impurity regions upon application between the corresponding terminals of an electrostatic energy that is larger than a predetermined amount, the first additional high concentration impurity region being at least part of the first resistor high concentration impurity region or the second resistor high concentration impurity region.

12. The semiconductor switching device of claim 10, further comprising an additional protecting element connected between the common input terminal and the second control terminal, the additional protecting element comprising a first additional high concentration impurity region, a second additional high concentration impurity region and an additional insulating region disposed between the first and second additional high concentration impurity regions and the additional protecting element being configured to permit current flow between the first and second additional high concentration impurity regions upon application between the corresponding terminals of an electrostatic energy that is larger than a predetermined amount, the first additional high concentration impurity region being at least part of the second resistor high concentration impurity region, wherein the protecting element is disposed along a side of the common input terminal and the additional protecting element is disposed along another side of the common input terminal.

13. The semiconductor switching device of claim 10, wherein the second high concentration impurity region is disposed along at least one side of the bonding pad.

14. The semiconductor switching device of claim 10, wherein the common input terminal comprises a bonding pad, and at least part of the second high concentration impurity region is placed in close proximity to the bonding pad to permit the current flow upon the application of the electrostatic energy.

15. The semiconductor switching device of claim 14, wherein the second high concentration impurity region is disposed along at least one side of the bonding pad.

16. The semiconductor switching device of claim 14, further comprising a peripheral high concentration impurity region disposed at a peripheral area of the bonding pad, wherein the second high concentration impurity region is part of the peripheral high concentration impurity region.

* * * * *